United States Patent
Diegel et al.

(10) Patent No.: US 10,859,404 B2
(45) Date of Patent: Dec. 8, 2020

(54) MAGNETIC REVOLUTION COUNTER FOR SELF-DETECTING ERROR STATES WHEN DETERMINING NUMBERS OF REVOLUTIONS WHICH CAN BE DETERMINED BY SAID REVOLUTION COUNTER

(71) Applicants: Leibniz-Institut Fuer Photonische Technologien e.V., Jena (DE); Horst Siedle GmbH & Co. KG, Furtwangen (DE)

(72) Inventors: Marco Diegel, Jena (DE); Peter Dingler, Aalen (DE); Roland Mattheis, Jena (DE); Manfred Scherzinger, Ostfildern (DE)

(73) Assignees: Horst Siedle GmbH & Co. KG, Furtwangen (DE); Leibniz-Institut Fuer Photonische Technologien E.V., Jena (DE)

( * ) Notice: Subject to any disclaimer, the term of this patent is extended or adjusted under 35 U.S.C. 154(b) by 164 days.

(21) Appl. No.: 16/060,485

(22) PCT Filed: Dec. 7, 2016

(86) PCT No.: PCT/DE2016/000433
§ 371 (c)(1),
(2) Date: Jun. 8, 2018

(87) PCT Pub. No.: WO2017/097284
PCT Pub. Date: Jun. 15, 2017

(65) Prior Publication Data
US 2018/0356252 A1 Dec. 13, 2018

(30) Foreign Application Priority Data
Dec. 11, 2015 (DE) .......................... 10 2015 016 164

(51) Int. Cl.
*G01D 5/16* (2006.01)
*G01R 33/09* (2006.01)
(Continued)

(52) U.S. Cl.
CPC ............... *G01D 5/16* (2013.01); *G01D 3/022* (2013.01); *G01D 5/145* (2013.01); *G01D 5/2033* (2013.01);
(Continued)

(58) Field of Classification Search
CPC .......... G01P 3/487; G01P 3/488; G01P 13/04; G01D 5/16; G01D 3/022; G01D 5/145;
(Continued)

(56) References Cited

U.S. PATENT DOCUMENTS

| | | | |
|---|---|---|---|
| 6,998,839 B2 * | 2/2006 | Doescher | B82Y 25/00 324/207.21 |
| 7,239,131 B2 * | 7/2007 | Halder | B62D 15/02 324/207.21 |

(Continued)

FOREIGN PATENT DOCUMENTS

| | | | |
|---|---|---|---|
| DE | 10 2004 020149 A1 | 11/2005 | |
| DE | 102008037975 A1 * | 3/2009 | ......... G11C 19/0808 |

(Continued)

OTHER PUBLICATIONS

International Search Authority—PCT/DE2016/000433—Written Opinion of the ISA, dated Apr. 2017. (Year: 2017).*

Primary Examiner — Patrick Assouad
Assistant Examiner — Sean Curtis
(74) Attorney, Agent, or Firm — Norris McLaughlin, P.A.

(57) ABSTRACT

A magnetic revolution counter for the self-identification of error states includes magnetic domain wall conductors which are composed of open spirals or closed, multiply-wound loops, formed by a GMR layer stack or a sort
(Continued)

magnetic layer of locally present TMR layer stacks and in which the magnetic 180° domain walls can be introduced and located, wherein a predefinable bijective magnetization pattern of domain walls and/or domain wall gaps is written in, and the associated signal levels thereof are stored in the form of signal level sequences in a first memory in tabular form, which is compared to tabular target value patterns of the signal level sequences stored in a second memory for each permissible revolution i ($0 \leq i \leq n$), and a third memory is provided, in which tabular error target value patterns of deviations of signal level sequences, caused thereby, from regular signal level sequences stored in the second memory are stored.

13 Claims, 15 Drawing Sheets

(51) Int. Cl.
| | |
|---|---|
| *G01D 5/244* | (2006.01) |
| *G01D 3/02* | (2006.01) |
| *G01D 5/14* | (2006.01) |
| *G01D 5/20* | (2006.01) |
| *G01P 3/487* | (2006.01) |
| *G01P 3/488* | (2006.01) |
| *G01P 13/04* | (2006.01) |

(52) U.S. Cl.
CPC ....... *G01D 5/2449* (2013.01); *G01D 5/24476* (2013.01); *G01P 3/487* (2013.01); *G01P 3/488* (2013.01); *G01P 13/04* (2013.01); *G01R 33/093* (2013.01); *G01R 33/098* (2013.01)

(58) Field of Classification Search
CPC ............. G01D 5/2033; G01D 5/24476; G01D 5/2449; G01R 33/093; G01R 33/098
USPC ........................................ 324/207.21, 207.25
See application file for complete search history.

(56) References Cited

U.S. PATENT DOCUMENTS

| | | | | |
|---|---|---|---|---|
| 7,671,583 | B2 * | 3/2010 | Diegel | G01D 5/2033 |
| | | | | 324/207.21 |
| 8,179,130 | B2 * | 5/2012 | Mattheis | G01D 5/145 |
| | | | | 324/207.25 |
| 9,958,511 | B2 * | 5/2018 | Zimmer | G01R 33/096 |
| 10,228,267 | B2 * | 3/2019 | Mattheis | G01R 33/093 |
| 10,415,998 | B2 * | 9/2019 | Dietrich | G01D 5/16 |
| 10,670,386 | B2 * | 6/2020 | Zimmer | G01B 7/30 |
| 2005/0237054 | A1 * | 10/2005 | Halder | G01D 5/14 |
| | | | | 324/207.21 |
| 2007/0285087 | A1 * | 12/2007 | Diegel | G01P 3/487 |
| | | | | 324/207.25 |
| 2010/0301842 | A1 * | 12/2010 | Mattheis | G11C 19/0808 |
| | | | | 324/207.25 |
| 2015/0263656 | A1 | 9/2015 | Shigehara | |
| 2016/0161574 | A1 * | 6/2016 | Zimmer | G01R 33/093 |
| | | | | 324/252 |
| 2016/0265941 | A1 * | 9/2016 | Mattheis | G01R 33/098 |
| 2017/0261345 | A1 * | 9/2017 | Schmitt | G01D 5/145 |
| 2018/0172477 | A1 * | 6/2018 | Dietrich | G01D 5/16 |
| 2018/0356252 | A1 * | 12/2018 | Diegel | G01P 13/04 |
| 2018/0372510 | A1 * | 12/2018 | Mattheis | G01D 5/145 |
| 2019/0195613 | A1 * | 6/2019 | Zimmer | G01B 7/30 |
| 2019/0323819 | A1 * | 10/2019 | Zimmer | G01D 5/12 |
| 2019/0383643 | A1 * | 12/2019 | Schmitt | G01D 5/145 |
| 2019/0383645 | A1 * | 12/2019 | Tonge | G01D 5/24476 |

FOREIGN PATENT DOCUMENTS

| | | | |
|---|---|---|---|
| DE | 10 2008 063226 A1 | 7/2010 | |
| DE | 10 2010 010893 A1 | 9/2010 | |
| DE | 10 2010 022611 A1 | 12/2011 | |
| DE | 10 2011 075306 A1 | 11/2012 | |
| DE | 10 2013 018680 A1 | 5/2015 | |
| DE | 10 2015 0103456 A1 | 9/2015 | |
| WO | WO-2004020952 A2 * | 3/2004 | ............ G01D 5/14 |
| WO | WO-2005106395 A1 * | 11/2005 | ........... G01D 5/2033 |
| WO | WO-2017097284 A1 * | 6/2017 | ............ G01D 3/022 |
| WO | WO-2017097285 A1 * | 6/2017 | ........... G01D 5/2449 |

* cited by examiner

FIG. 3a
FIG. 3b
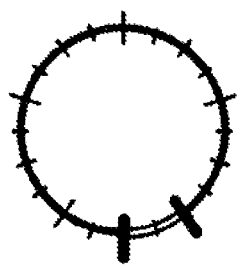
FIG. 3c
FIG. 3d
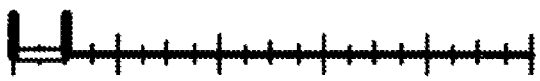
0   FIG. 3e
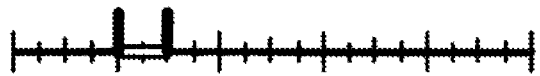
1   FIG. 3f
2   FIG. 3g
3   FIG. 3h
4   FIG. 3i
0   FIG. 3j
1   FIG. 3k
2   FIG. 3l Quadrant: 1 2 3 4 1 2 3 4

S5 + S8 : 0U + 2U --> 10 U
S5 + S9 : 0U + 1U --> 10 U
S8 + S9 : 2U + 1U --> 10 U

S5 + S8 : 0U + (2U + F) --> 10 U + F
S5 + S9 : 0U + 1U       --> 10 U
S8 + S9 : (2U + F) + 1U --> 10 U + F

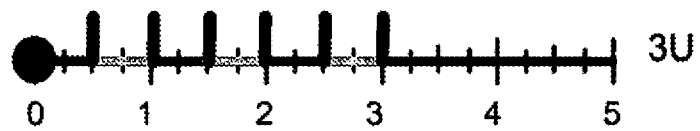 3U  FIG. 11a
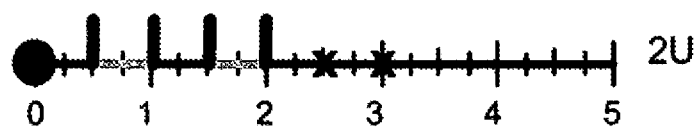 2U  FIG. 11b
 3U + F  FIG. 11c
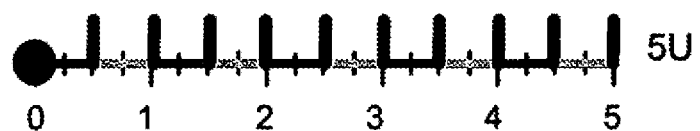 5U  FIG. 11d
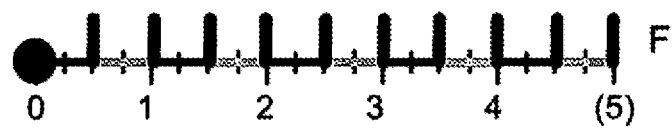 F  FIG. 11e
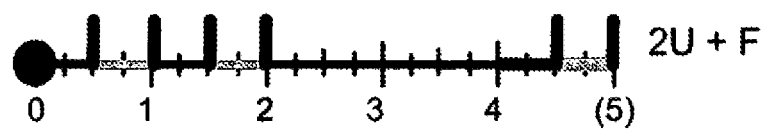 2U + F  FIG. 11f
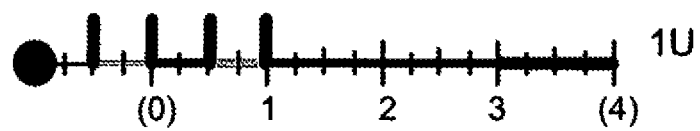 1U  FIG. 11g
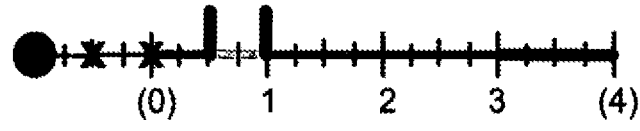 1U + F  FIG. 11h

MAGNETIC REVOLUTION COUNTER FOR SELF-DETECTING ERROR STATES WHEN DETERMINING NUMBERS OF REVOLUTIONS WHICH CAN BE DETERMINED BY SAID REVOLUTION COUNTER

BACKGROUND OF THE INVENTION

The invention relates to a magnetic revolution counter for the self-identification of error states in these revolution counters and for the determination of numbers of revolutions of an outer magnetic field ascertainable by way of this revolution counter, which advantageously can be used in multifaceted fields of technology, and in particular in automotive engineering and transmission manufacturing, since such revolution counters can have a miniaturized design and can be operated in a currentless manner.

In principle, revolution counters for the non-contact and powerless counting of revolutions, using magnetic domain walls (DW), are known per se and described in detail, for example, in DE 10 2008 063 226 A1, DE 102010 022 611 A1, DE 102011 075 306A1 and DE 10 2013 018680 A1.

The revolution counters disclosed in the above documents have the following in common:

The sensor systems used are composed of at least one sensor element and at least one outer magnetic field, wherein either the sensor element is moved past the magnetic field or rotated, or the magnetic field is moved past the sensor element or rotated, in a non-contact manner.

The sensor element at least partially has a layer composition comprising at least one hard magnetic layer and at least one soft magnetic layer, these being separated by a non-magnetic layer. During operation of the sensor system, rotating or moving the magnetic field past the sensor element (or vice versa) can change only the magnetization of the soft magnetic layer, and not the magnetization of the hard magnetic layer. In this way, the magnetization of the soft magnetic layer in the sensor element will be oriented entirely or partially substantially parallel or substantially anti-parallel to the magnetization of the hard magnetic layer. This differing orientation of the magnetizations results in a difference in the electrical resistance in different conductor sections, which can be read out by way of the GMR or TMR effect.

Within the soft magnetic layer, two differently magnetized regions are separated from one another by a magnetic domain wall (DW).

During operation of the sensor system, a change in position of the outer magnetic field, for example due to rotation, in the sensor element results in a powerless movement of the magnetic domain walls that exist in the sensor element.

The read-out DW positions are assigned to bijectively determined revolutions (numbers of revolutions) ascertainable by way of the specific revolution counter, and are ascertained in evaluation electronics. In preferred embodiments, multiple sensor elements or multiple parts of a sensor element are electrically interconnected with one another to form Wheatstone bridges or Wheatstone half bridges, whereby the influence of the temperature on the magnetoresistive signal is suppressed.

The revolution counters according to DE 10 2008 063 226 A1 are geometrically formed by a rhombus-shaped spiral, which ends in a large surface area at one end. This large, preferably circular, surface area acts as a domain wall generator (DWG), and is formed of the same material as the spiral. After every 180° magnetic field rotation or 180° sensor element rotation, a so-called 180° domain wall is generated in this domain wall generator at the transition from the surface area to the spiral. This 180° DW migrates into the spiral. The generated 180° DW are transported to the spiral end with a direction of rotation of the magnetic field in the spiral direction of rotation, and the domain walls are transported toward the DWG with a direction of rotation opposite the spiral direction of rotation. In this process, the 180° DW arriving first at the DWG from the spiral annihilates with the 180° DW generated simultaneously in the DWG. By successive rotation of the magnetic field, the spiral can thus be incrementally deleted from domain walls. The rotation of the sensor element with respect to the magnetic system, which is mounted in a stationary manner, is equivalent to the rotation of the magnetic field at the stationary sensor element.

Revolution counters according to DE 10 2011 075 306 A1 are composed of two rhombus-shaped spirals comprising a respective DWG at each end having oppositely oriented directions of rotation, or of a combination of these two spirals comprising only one DWG at one end or in the center.

These revolution counters according to DE 10 2008 063 226 A1 and DE 10 2011 075 306 A1 have in common that, with each half revolution, the number of the 180° domain walls in each spiral changes by one.

This is different in the revolution counters that comprise at least one closed loop having at least one intersection (DE 10 2013 018 680 A1) or at least one closed loop having at least one bridge (DE 10 2010 022 611 A1). In these revolution counters, the two ends of a spiral were connected to one another to form a closed loop. With n windings, the direct connection intersects (n−1) windings. A two-turn spiral thus becomes a loop having one intersection, and a three-turn spiral becomes a loop having two intersections. Each winding can accommodate a maximum of two domain walls, so that a maximum of 2n domain walls can exist in a loop having n windings.

In a closed loop, no DW is generated or destroyed during regular counting operation. A destruction or generation of domain walls would result in a counting error and must be precluded. Revolution counters comprising at least one closed loop require an exact number of domain walls to be written to the sensor element during an initialization process.

Some embodiments of revolution counters comprising open spirals having DWG can be mechanically initialized. In a spiral having n windings, for example, this takes place by a movement of the sensor element or of the outer magnet of the sensor system by at least n revolutions, so as to fill the spiral completely with domain walls. Subsequent rotation in the opposite direction by n revolutions clears the spiral of domain walls. For applications counting clockwise and counterclockwise revolutions, the spiral is maximally filled with DW using n revolutions for an initialization in the center position, and thereafter is cleared except for n/2 DW using n/2 revolutions having the opposite direction of rotation.

All above-described revolution counters have in common that the counting of revolutions takes place in a powerless manner by transporting domain walls in closed loops, or by transporting and generating or destroying domain walls in open spirals. The counted revolutions are also stored in a powerless manner by way of bijective DW positions and/or DW numbers in the sensor element.

In contrast, power is required for reading out the sensor element. In preferred embodiments, the giant magneto resistance (GMR) effect or the tunneling magneto resistance (TMR) effect is utilized for this purpose, wherein multiple sensor elements or parts of a sensor element according to the known prior art are interconnected to form Wheatstone half bridges or Wheatstone bridges.

Depending on the magnetization, a sensor element has differing electrical resistances or differing potentials in different sections, which can be read out if the sensor element, or a part of the sensor element, is interconnected in Wheatstone half bridges or Wheatstone bridges. For reading out the magnetization state, a measuring current is conducted through the sensor element (or the Wheatstone (half) bridge), and the measurement result is compared to defined threshold values.

Depending on whether a drop below a threshold value occurs or the threshold value is exceeded, a decision can be made as to whether or not the measurement result corresponds, for example, to the state "a DW is present in this half bridge."

In revolution counters according to DE 10 2008 063 226 A1, a rhombus shape having individual contacting of half windings in Wheatstone half bridges was introduced for the first time. This particularly advantageous design having a square shape uses four webs at a 90° angle with respect to one another per winding. Two respective webs are connected to one another by quarter circles or quarter circle-like polygonal lines. The quarter circles are covered with electrical contacts, which additionally cover parts of the abutting webs so that the non-contacted parts of all webs between the electrical contacts are preferably equal in length. The four webs of each winding are interconnected to form two Wheatstone half bridges. The reference direction is in the diagonal of the rhombus or of the square and is perpendicular to the line between the VCC (voltage higher than ground) contact and the GND (ground) contact. In this way, bijective assignment to the revolution number using only one square (rhombus-shaped) spiral is always possible for every field angle. As presented in the publication "IEEE Transactions on Magnetics, Vol. 45, No 10, pp 3792-3795, 2009," this allows bijective assignment of the magnetization to the counted revolution for all revolutions that can be counted by way of the sensor.

This geometry makes revolution counters having an ascertainable revolution number of n>10 possible. In the "RSM 2800" sensor system from Novotechnik, the technology of a square spiral for counting up to 16 revolutions is implemented.

The geometric areas in which the domain walls are located within the spiral or loop the majority of the time are hereafter referred to as domain wall positions (DW positions). In the case of square or rhombus-shaped spirals, these are the quarter circles or quarter circle-like polygonal lines connecting two respective straight webs to one another. For a DW to traverse a quarter circle, the outer magnetic field must be rotated by 90°, plus a hysteresis angle of typically 5° to 20°. As soon as the DW is transported to the transition from the quarter circle to the web, and the applied field depins the DW, the DW traverses the web at a speed of several 100 m/sec in a few 100 ns. Within this very short time, the rotation of the magnetic field is negligibly small.

There are four quarter circles per winding in the case of a square spiral (or a square loop), and thus four DW positions, which are covered with the electrical contacts of two Wheatstone half bridges. The VCC contact is located above a DW position, the GND contact is located above the opposite DW position, and the two interposed DW positions are each covered with a center contact.

In all above-described revolution counters according to the known prior art, the DW positions contacted with a Wheatstone half bridge center contact have an angular separation of 180°.

By selecting the direction of the reference magnetization in the GMR layer stack, the Wheatstone half bridge is at the center potential when a DW in the DW position is positioned beneath the center contact, and it is at the high potential or at the low potential when the DW in the DW position is positioned beneath the VCC or the GND contact. The selection allows more variation for TMR layer stacks.

For each 180° magnetic field rotation, the domain walls stored in the sensor element are transported into the neighboring Wheatstone half bridge during error-free operation. In the revolution counters having a constant DW number, the DW arrangement thus shifts by the angular separation of 180° in the sensor element, and in the spiral comprising a DWG, additionally the number of the domain walls in the spiral changes by one DW. This movement is verified via the electrical read-out of the Wheatstone bridges or half bridges.

All these revolution counters have in common that the field H of the magnet of the sensor system during operation must be located within a "magnetic window" between $H_{min}$ and $H_{max}$, wherein $H_{min}$ must be larger than the maximum depinning field $H_{depinn}$ and $H_{max}$ must be smaller than the nucleation field $H_{Nuk}$ of the sensor element:

$$H_{depinn} < H_{min} \leq H \leq H_{max} < H_{Nuk}$$

The maximum field $H_{max}$ and the minimum field $H_{min}$ are predefined by the application. All these revolution counters furthermore have in common that the sensor elements are suitably tested at the maximum field $H_{max}$ and the minimum field $H_{min}$ of the application regarding a certain error probability of less than $10^{-7}$, for example. Within this magnetic window, the domain walls are reliably transported.

With the exception of the revolution counters according to DE 10 2011 075 306 A1, all above-described revolution counters according to the prior art have in common that no identification of error states is provided and implemented in any of the embodiments.

Revolution counters according to DE 10 2011 075 306 A1 use a system of two (rhombus-shaped) spirals having opposing directions of rotation to identify error states due to deleted domain walls or nucleated domain walls. The two spirals either each include a domain wall generator (DWG) or a shared DWG in the center. During regular counting operation, one DW is thus injected into a spiral per 180° field rotation and transported away from the DWG and at the same time, in the other spiral, a DW transported to the DWG is deleted by annihilation with a DW injected by the DWG. In the mechanically blocked end positions, the spiral having a ccw direction of rotation, for example, is thus completely filled with domain walls in one end position, and the spiral having a cw direction of rotation is DW-free, and in the other end position, the spiral having a ccw direction of rotation is DW-free, and the spiral having a cw direction of rotation is completely filled with domain walls. The total number of domain walls in the two spirals remains the same in these revolution counters. This makes it possible to identify when domain walls nucleate or annihilate in a spiral since, in this way, the total number of domain walls changes compared to the DW number which is provided in regular counting operation. Since the DW number remains constant only in sum during regular counting operation, but not in each individual spiral, in an error state, it is not possible to detect in which spiral the error has occurred. It is thus likewise not possible to ascertain the revolution number in the error state with this approach.

The identification of faulty measurements and/or malfunctions of sensors and the redundant ascertainment of measured values, particularly in the automobile sector, is a frequent requirement and matter of various regulations and standards (such as ASIL C).

The following error states exist with magnetic revolution counters:
a. electric error state, due to a short circuit within the Wheatstone (half) bridge or the open circuit of a conductor or of a sensor web;
b. magnetic error state, due to the decrease (DW annihilation) or increase (DW nucleation) in the DW number or the (partial) "non-movement" (DW pinning) of a DW in the sensor element. Electric error states due to a short circuit or conductor open circuit or sensor web open circuit cause signal levels that do not correspond to the permissible signal levels of high, medium or low for the Wheatstone (half) bridges. An electric error state permanently prevents the detection of the counted revolutions.

In the "DW pinning" error state, at least one DW is not transported for at least half a revolution during a revolution count, whereby the angular separation with respect to other, regularly transported domain walls changes. In the "DW annihilation" error state, a DW is transported toward a pinned DW, such that these two domain walls cancel one another. In the "DW nucleation" error state, two domain walls having an angular separation of 180° with respect to one another are generated in the sensor element, or multiples of two respective domain walls are generated. The "magnetic" error states in general prevent the correct detection of the revolution number, which is to say they result in faulty measurements.

SUMMARY OF THE INVENTION

It is the object of the present invention to create revolution counters that identify faulty measurements of the revolution number during ongoing operations, without the comparison to external third-party means, and, in preferred embodiments, enable the continued operation of the revolution counter without re-initialization.

The essence of the invention is that, initially, a magnetic revolution counter is provided for determining a predefinable number of revolutions to be determined of an outer magnetic field, generated by a rotating element, or a magnet wheel, or a linear magnetic scale;
comprising magnetic domain wall conductors, which are composed of open spirals or closed multiply-wound loops, which are formed by a GMR layer stack or a soft magnetic layer comprising locally present TMR layer stacks and
in which magnetic 180° domain walls can be introduced and located by measuring the electrical resistance of predefinable spiral or loop sections, in part in keeping with the known prior art,
wherein, according to the invention, here however one magnetic domain wall or at least two magnetic domain walls, or in preferred embodiments, four magnetic domain walls, are introduced into the domain wall conductors by way of means for generating, pinning or deleting, in a defined manner, domain walls and
electrical contacts are provided on the domain wall conductors such that the domain wall conductors, located diagonally opposed, are captured by a respective VCC contact and GND contact collectively or in groups of multiple VCC and GND contacts for a multiplex read-out, and
electrical contacts are provided either on both sides or, in preferred embodiments according to the invention, solely on one side, based on the diagonal extending over the VCC and the GND contacts, which
contact a respective winding, or multiple windings in the case of a multiplex read-out, on each interposed domain wall conductor section substantially centered between the aforementioned VCC and GND contact(s), and
the aforementioned contacts are interconnected to form separate Wheatstone half bridges, which can preferably be read out simultaneously or, in the case of a multiplex read-out, in rapid succession, essentially simultaneously,
wherein the resistance conditions ascertained by the Wheatstone half bridges are all stored as a signal level in a memory in tabular form, which for the determination of the present revolution number is continuously compared to tabular target value patterns which are stored in a further memory and correspond to the specific revolution number, and
when no agreement exists between a target value pattern and the resistance conditions ascertained by the Wheatstone half bridges, this is compared to a tabular error target value pattern, which is stored in a further memory and corresponds to the specific revolution number and a certain error, and
may be output as a bijective revolution value or displacement value, or directly as an incorrectable error.

As an alternative to reading out the sensor element by way of potential measurements using an interconnection into Wheatstone bridges, the invention also provides for reading out the sensor element by measuring the (TMR) resistances of all windings. For this purpose, either each individual winding is contacted with a respective GND contact and a respective VCC contact or, in preferred embodiments using a multiplex read-out, is contacted with a shared GND contact and a respective VCC contact on each winding, or with a shared VCC contact and a respective GND contact on each winding. The GND and VCC contacts are preferably disposed diagonally opposed. FIG. 15 shows one embodiment of this interconnection. The ascertained resistances here, similarly to the interconnection using Wheatstone half bridges, are all stored as a signal level in a memory in tabular form, which for the determination of the present revolution number is continuously compared to tabular target value patterns which are stored in a further memory and correspond to the specific revolution number.

Corresponding to the prior art, preferred embodiments comprise a rotation angle sensor, or a quadrant sensor, so as to compare the measured values only to those target value patterns that are tied to the measured field angle quadrant, by preselecting a field angle quadrant. This reduces the number of the maximum required comparisons to one quarter, thereby speeding up the determination of the revolution number.

The number of the maximum required comparisons for the determination of the revolution number is furthermore kept low in that, during regular counting operation, the DW number remains constant, whereby only exactly one possible signal pattern exists per revolution and field angle quadrant, and thus also only one target value pattern must be stored in each case for comparison.

According to the present invention, the open spirals or the closed, multiply-wound loops forming the domain wall conductors have a substantially rhombus-shaped design, wherein the aforementioned contacts capture the corner regions of the rhombuses. Furthermore, according to the invention the defined separation is preferably established at 540° when using two neighboring domain walls.

Instead of using GMR layer stacks, it is also possible, according to the invention, for the domain wall conductors to be made of a soft magnetic material, such as permalloy, and for the VCC and GND contacts to be placed on the TMR layer stack, which are provided on the domain wall conductors, for example in the center. The electrical center contacts, in contrast, contact the soft magnetic domain wall conductor directly in the corner regions of the aforementioned rhombuses here as well.

The essence for determining the revolution numbers is that the determination of the counted revolution takes place by way of evaluation electronics, which, in a first step, carries out a comparison of the signals of all read-out Wheatstone half bridges (or the resistances of all windings in the case of resistance measurement) and using a stored table, in which the respective signals of the Wheatstone half bridges (or the resistances of all windings) are stored for each countable revolution. This means that the counted revolution output by the evaluation electronics is that in which the pattern from the measured signal voltages from winding 1 to winding n of the open spirals or closed, multiply-wound loops agrees with a stored signal pattern for winding 1 to winding n. If no agreement was found, the comparison of the measured signals of all read-out Wheatstone half bridges (or the resistances of all windings in the case of resistance measurements) takes place in a second step, using a further stored table in which the respective signals of the Wheatstone half bridges (or the resistances of all windings) are stored in a further memory for each countable revolution and for each possible error state.

Due to the 90° angles in the preferred embodiments comprising a square spiral or closed square loop, the potential changes after a respective 90° field rotation so that, at least for each 90° field angle range (field angle quadrant), a corresponding target value pattern is stored, which is selected with the measured value from the angle sensor (or quadrant sensor) for the comparison to the revolution counter signals. Correspondingly, error target value patterns are additionally kept available for every field angle quadrant for comparison.

The magnetization patterns impressed into the loops or spirals thus enable a bijective determination of the counted revolutions even with a permissible hysteresis of ±45°. For operating safety reasons, the field strengths selected (such as 120% of $H_{min}$) will always be strengths at which the actual hysteresis is always considerably smaller than ±30°.

All embodiments of the revolution counter according to the invention have a bijective magnetization pattern (MP) for each countable revolution. Each sensor element comprising a GMR layer stack is interconnected to form Wheatstone (half) bridges and is read out by way of potential measurements. Sensor elements comprising a TMR layer stack may be interconnected to form Wheatstone (half) bridges. As an alternative, instead of a potential measurement, it is also possible to measure the tunneling contact resistances, due to the large TMR swing of >100%. Deviating from the prior art, according to the invention the read-out electronics substantially always read out all Wheatstone (half) bridges or tunneling contact resistances simultaneously. The measured signal levels of the Wheatstone (half) bridges are processed in a defined sequence, for example in the sequence from winding 1 to winding n in the case of a spiral having n windings. This sequence of signal levels is referred to hereafter as signal level sequence (SLS). The measured SLS is compared to stored target value SLS, which are kept available by the read-out electronics for each countable revolution. These target value SLS are novel over the prior art and, for the first time, allow the reliable detection of electric and magnetic error states. The read-out electronics detect electric error states based on impermissible signal levels and magnetic error states, for example in two steps. In the first step, the read-out electronics identifies a magnetic error state based on there being no agreement between the measured SLS and a target value SLS. In the second step, the read-out electronics detect the error state as a result of an agreement of the measured SLS with a target value error SLS, which, in advantageous embodiments, are kept available by the read-out electronics, or are calculated by the read-out electronics, for any conceivable counting error and for each countable revolution. Keeping target value error SLS available or calculating target value error SLS is novel over the prior art. As a function of the initialized MP, in advantageous designs, the read-out electronics then output an error value, or an error value and, nonetheless, the correct revolution number.

The detection of the three possible magnetic error types, these being DW pinning, DW annihilation and DW nucleation, is only possible when the DW number remains constant during regular counting operation. Advantageous designs according to the invention use sensor elements in which the DW number always remains unchanged after the initialization in the error-free counting operation, which is to say they either do not include a DW generator (DWG), or they include two complementarily acting DW generators (which is to say, one DW is generated by the first DWG, while one DW is annihilated at the same time at the second DWG).

Advantageous designs according to the invention use sensor elements in which the DW number remains constant in the error-free counting operation, and initialize MP having four or more domain walls, which always allow the revolution number to be ascertained. These MP are redundant in the read-out of the number of the counted revolutions and are likewise novel over the known prior art.

Further advantageous designs according to the invention use sensor elements that, topologically, enable redundant revolution counting.

The core of the revolution counters according to the invention is the combination of device components, these being the sensor elements having defined MP, and the target value SLS and target value error SLS kept available in memories, and the comparison of the measured SLS to the target value SLS and the target value error SLS. Keeping target value SLS and target value error SLS available, which is novel over the prior art, wherein comparing these to the actually ascertained SLS takes place in read-out electronics in advantageous embodiments. When this read-out electronics, which is novel over the prior art, is combined with sensor elements according to the prior art, these revolution counters, which are known per se, for the first time, also make error monitoring possible during the counting operation.

The advantageous designs of the invention use magnetization patterns (MP) having a constant DW number. An MP is defined by the initialized positions of domain walls or DW gaps (DWG) within a chain of domain walls in the MP. For an MP to be suitable for ascertaining the revolution number, all MP that arise during the movement as a result of a change in the magnetic field must include significantly different electrical signals. Proceeding from an MP comprising a sensor element that, initially, is entirely occupied by domain walls, a simple pattern having this property is created by deleting at least two neighboring domain walls. This means that these two DW have been replaced by two DWG having an angular separation of 180° with respect to one another, whereby an angular separation of 540° arises between the two remaining domain walls that each abut the DWG. During regular counting operation, this MP is transported within the sensor element synchronously with the counted revolutions, wherein the angular separations between two respective domain walls in the MP remain constant for most of the time. Only during the transport of the MP is it possible for the traversing of the web by the DW to differ by a few angular degrees, caused by the hysteresis of the domain wall movement.

The initialization of the MP can take place both in open spirals according to the prior art, and in closed loops having a current-induced Oersted field. In the case of the DW deletion, two neighboring domain walls at a time are annihilated beneath a conductor (25 in FIG. 3a), or, in the case of the DW generation, two DW at a time are nucleated beneath the conductor (25 in FIG. 3a), which thereafter immediately diverge to an angular separation of 180°.

Advantageous designs use Wheatstone half bridges that are all always read out in a defined sequence, for example from the outermost to the innermost winding of a spiral.

Due to the 90° angles in the advantageous square spiral or loop, the potential changes after a respective 90° field rotation, resulting in a different signal level sequence (SLS) for each 90° field angle range (field angle quadrant). An MP is represented by the signal levels of the Wheatstone half bridges including the DW positions in which the domain walls are located. This means that, within the signal level sequence (SLS) of all half bridges, the signal level sequence of the MP (SLS-MP) during regular counting operation is well-defined for a certain field angle quadrant and is different from all other SLS corresponding to different field angle quadrants, since the position of the SLS-MP within the SLS changes with the revolution number. The read-out electronics detect the revolution number based on the position of the SLS-MP, or based on the position of a DW within the SLS-MP.

Advantageous designs determine the revolution number, wherein the evaluation electronics carry out a comparison between the SLS of all read-out Wheatstone half bridges and a stored table, which has stored the respective target value SLS of the Wheatstone half bridges for each countable revolution (broken down for each field angle quadrant). This means that the evaluation electronics output the revolution number at which the measured SLS of Wheatstone half bridge 1 (W1) to Wheatstone half bridge n (Wn) agrees with a stored target value SLS for W1 to Wn. Prior to the comparison, the angle sensor measured value is evaluated for the determination of the corresponding field angle quadrant (see FIG. 2), or of the angle sections or linear scale sections, depending on the design of the acting magnetic element.

Based on the comparison of the measured SLS with the stored target values, the read-out electronics also identify whether the DW number has changed compared to the number in the initialized MP or, if the DW number is the same, whether the angular separation between (at least) two domain walls has changed. This is because these errors result in SLS that do not agree with the target values. It depends on the type of the error, the number of the domain walls initialized in the MP and (additionally) stored SLS having error states, whether or not the read-out electronics in this error case are still able to output a plausible revolution number. This will be described in more detail hereafter.

The following advantageous exemplary embodiments and figures are intended to provide a further description of the above and of the invention, without thereby limiting the invention.

BRIEF DESCRIPTION OF THE DRAWINGS

In the drawings:

FIGS. 3a to 3l schematically show three sensor element geometries, which enable a constant DW number using a magnetization pattern (MP) composed of two domain walls (FIGS. 3a, 3c and 3d) or using an MP including two DW gaps (FIG. 3b). FIGS. 3e to 3i, and 3i to 3l, respectively, show how the revolution counting transports the MP including two domain walls, or two DW gaps, through the sensor element. The MP shown are illustrated without hysteresis and are not in any error state;

FIGS. 4c and 4d show two error-free MP, and FIGS. 4e to 4k show MP with exemplary error states. Whether or not these MP, in the error state, allow the determination of the revolution number is described;

FIGS. 11a to 11h schematically show MP in a sensor element that is known from the prior art and that is read out by way of read-out electronics according to the invention. The measures are required to detect error states are shown;

BRIEF DESCRIPTION OF THE INVENTION

Figure 1:
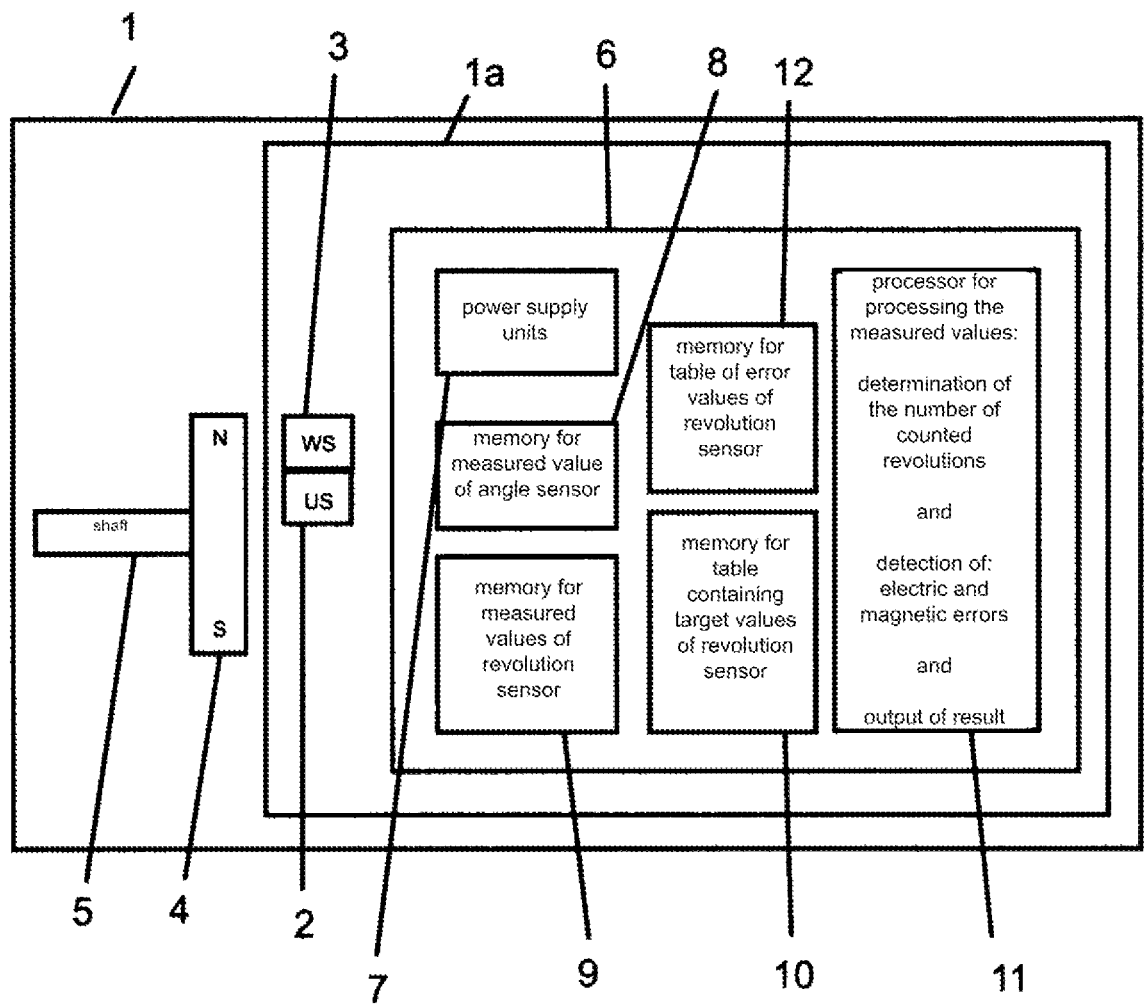
FIG. 1 shows the essential components of a revolution counter according to the present invention.

FIG. 1 shows a revolution counter system 1 comprising a revolution counter 1a according to the invention and a magnetic system 4 having a magnetic north (N) and a magnetic south (S) mounted to a rotating shaft 5. The revolution counter 1*a* comprises the following main components: a revolution sensor US 2, a 360° angle sensor WS 3 (or quadrant sensor), and electronics 6. The sensors 2 and 3 are mounted in a stationary manner and detect the angular position and number of revolutions of the rotating magnetic field. The electronics 6 include power supply units 7 for the sensors 2 and 3 and the processing of the measured values, by way of a memory 8 for the measured value of the angle sensor 3, a memory 9 for the measured values of the revolution sensor 2, a memory 10 for target values of the revolution sensor 2 stored in tabular form, and a memory 12 for stored error state values, and a processing unit 11. This processing unit 11 compares the measured values from the memories 8 and 9 to the tabular values from the memory 10 and outputs the result of each measurement. If the comparison of the measured values from memory 9 with the target values from memory 10 did not supply a valid value, the stored error values from memory 12 are compared with the measured values of the revolution counter from memory 9, so as to output also a plausible value for the revolution number, in addition to an error value, depending on the error that occurred.

Figure 2:
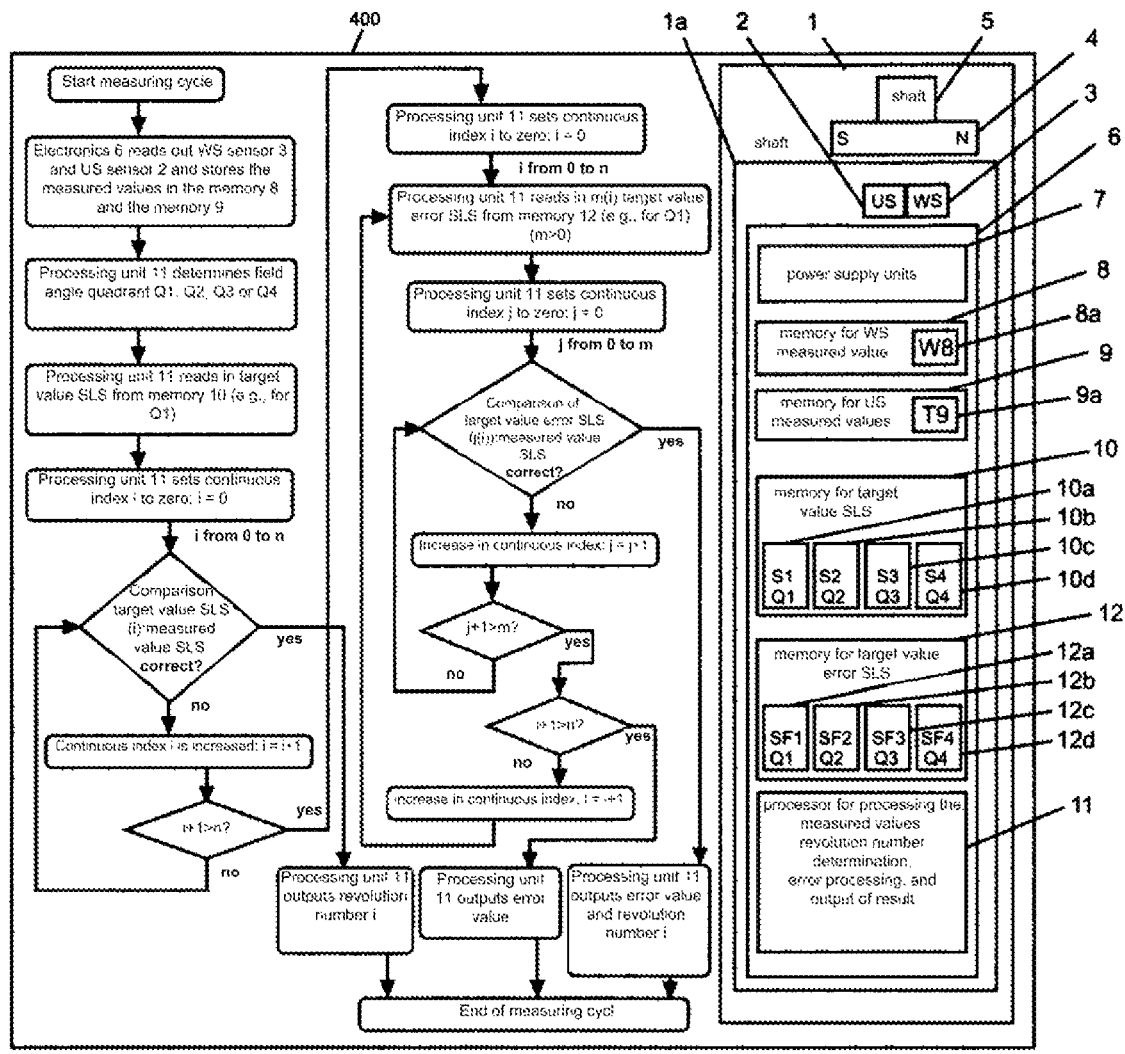
FIG. 2 shows a flow chart of the procedure of determining a revolution correlated with the associated assemblies.

FIG. 2 schematically shows the determination of the revolution number and the error detection in a flow chart 400 using a revolution counter system 1.

After the start of the measuring cycle,
the electronics 6, in the first step, read out the angle sensor WS 3 and the revolution number sensor US 2, and
in step 2, store the WS measured value W8 (8*a*) in the memory 8, and the US measured values in the memory 9, as a table T9 (9*a*));
in step 3, the processing unit 11 ascertains the associated field angle quadrant Q1, Q2, Q3 or Q4 from the angle sensor measured value;
in step 4, for the ascertained quadrant (such as Q1), the sub-table for the ascertained quadrant (such as S1Q1 (10*a*)) is loaded from the memory 10 comprising the target value SLS for the permissible revolutions i (0<i<n);
in step 5, the processing unit 11 sets the continuous index i to 0;
step 6 is an iterative comparison by the processing unit 11 between the measured values 9*a* and the target values (such as 10*a*) for the revolution i:
if the values agree, the read-out electronics in step 7 output the revolution number i and end the measuring cycle, or
if the values do not agree, the continuous index i is increased by one in step 7, and
in step 8, it is checked whether i>n:
if i>n, the error detection follows in step 9,
otherwise step 6 is repeated for the revolution i+1.
For the error detection, the processing unit 11, in step 9, sets the continuous index i to 0, and
in step 10, reads in the m(i) (0≤j≤m) sub-tables (such as SF1Q1 (12*a*)) of the m pre-computed errors from the memory 12 comprising the target value error SLS for the revolution i;
in step 11, the continuous index j is set to 0;
step 12 is a comparison between the measured values 9*a* and the target value error SLS for the error state j (for example, from sub-table SF1Q1 (12*a*)) for the revolution i:

if the values agree, the read-out electronics, in step 13, output the revolution number i and an error value for the error state and ends the measuring cycle;
if the values do not agree, the continuous index j is increased by one in step 14, and
in step 15, it is checked whether j>m;
if j<m, step 12 is repeated for the pre-computed error j+1;
if j>m, the query whether the continuous index i>n follows in step 16:
if yes, only an error value is output in step 17, and the measuring cycle is ended;
if no, the continuous index i is increased by one in step 17, and step 10 is repeated.

The measuring cycle ends with the output of a revolution number (step 7), or the output of a revolution number together with an error value (step 13), or the output of only an error value (step 17).

The output of an error value and of a valid revolution number presupposes that an MP was initialized that, even in the error state, still allows a valid revolution number to be determined.

FIG. 3 schematically shows three sensor element geometries, which enable a constant DW number using a magnetization pattern (MP) including two DW.

FIG. 3*a* schematically shows a five-turn spiral having two tips at the spiral ends, represented by a long horizontal line including vertical markings. Each vertical marking symbolizes a DW position (see quarter circle-like polygonal line 302 in FIG. 5) in a square spiral, the long markings symbolize full revolutions, the medium-length markings symbolize the half revolutions, and the short markings symbolize 90° or 270° field angle increments within a revolution of 360°. Domain walls are symbolized by the thick black vertical lines. The white areas on the horizontal line symbolize the magnetization in the ccw direction, and the gray areas of the horizontal line symbolize the magnetization in the cw direction. From a time perspective, domain walls predominantly remain in the quarter circles (DW positions, see FIG. 6). As a result, these are positioned in the quarter circles, symbolized by the vertical markings. The MP including the exemplary two domain walls has an angular separation of 180° between the domain walls. The MP can be moved within the spiral any arbitrary number of times from the very left across the shown position to the very right, and back. To prevent the MP from being transported out of the sensor element, the sensor element requires mechanical end stops, which are known per se and not shown.

FIG. 3*b* schematically shows a five-turn spiral including two domain wall generators (DWG) at the spiral ends, represented by a long horizontal line including vertical markings and two circles for the DWG on the outside. The DW positions and magnetizations are symbolized as described for FIG. 3*a*. The MP including two DW gaps (DWG) here, each symbolized by a cross, has an angular separation of 180° between the DWG and of 540° between the domain walls abutting the DWG. The MP including the two DWG can be moved within the spiral any arbitrary number of times from the very left across the shown position to the very right, and back. A DW gap may abut the DWG, as shown in FIG. 3*j*. The DW number remains constant during the transport of the MP. When the MP moves to the right, a DW is annihilated at the right DWG for each half revolution with a DW generated by the DWG and, at the same time, a DW is injected on the left into the spiral by the left DWG. To prevent the MP from being transported out of the sensor element, the sensor element again requires the aforementioned mechanical end stops.

FIG. 3c schematically shows a five-turn closed loop, represented by a circle including markings that are perpendicular to the circle, which as in FIG. 3a symbolize the DW positions. The MP including two domain walls has an angular separation of 180° between the domain walls, or of 1620° (4.5 windings). The MP can be transported through the loop cw or ccw any arbitrary number of times. A sensor element thus designed does not require any mechanical end stops.

FIG. 3d shows the sensor element of FIG. 3c in a geometrically modified, space-saving illustration. The five windings are illustrated as in FIG. 3a. The lower arch symbolizes the connecting web from the outer winding to the inner winding, which turns a spiral into a closed loop having intersections (see web 64 in FIG. 7).

FIGS. 3e to 3i show the sensor element from FIG. 3a with the MP in five different positions, which represent the revolution number 0 (FIG. 3e), 1 (FIG. 3f), 2 (FIG. 3g), 3 (FIG. 3h) and 4 (FIG. 3i). This assignment is dependent on the application, and not on the sensor element. Instead of 0 to 4 revolutions, the same MP positions could represent the revolutions −2 to +2 in another application. Proceeding from the MP position in FIG. 3e, the MP is transported further in the cw direction by four DW positions (corresponding to one winding) with each revolution. The MP comprising two domain walls having an angular separation of 180° remains unchanged.

FIGS. 3j to 3l schematically show the configuration of the MP from FIG. 3b when it is located in the positions that represent the revolution numbers 0, 1 and 2. The MP including the two DWG remains unchanged during the transport through the sensor element. Likewise, the total number of domain walls remains unchanged. When the MP is transported to the right, two domain walls disappear on the right with each revolution, and two new domain walls are added on the left.

FIG. 4 shows magnetization patterns (MP) in an exemplary five-turn, square spiral having two tips. The manner in which the hysteresis affects the DW positions within an MP is shown (FIGS. 4a and 4b). FIGS. 4c and 4d show two error-free MP, and FIGS. 4e to 4k show MP with exemplary error states. Hereafter whether or not these MP, in the error state, allow the determination of the revolution number is described.

Figure 4A:
FIGS. 4a to 4k schematically show MP in a five-turn, square spiral having two tips. The manner in which the hysteresis affects the DW positions with an MP is shown (FIGS. 4a and 4b)

FIG. 4a shows the MP from FIG. 3a including two domain walls in a position that, for example, represents the revolution zero. The two DW are positioned in two DW positions at an angular separation of 180° with respect to one another.

Figure 4B:
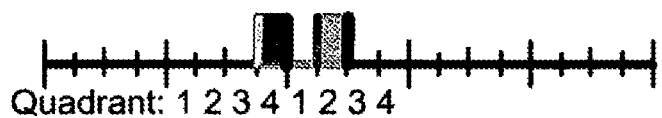
Figure 5:
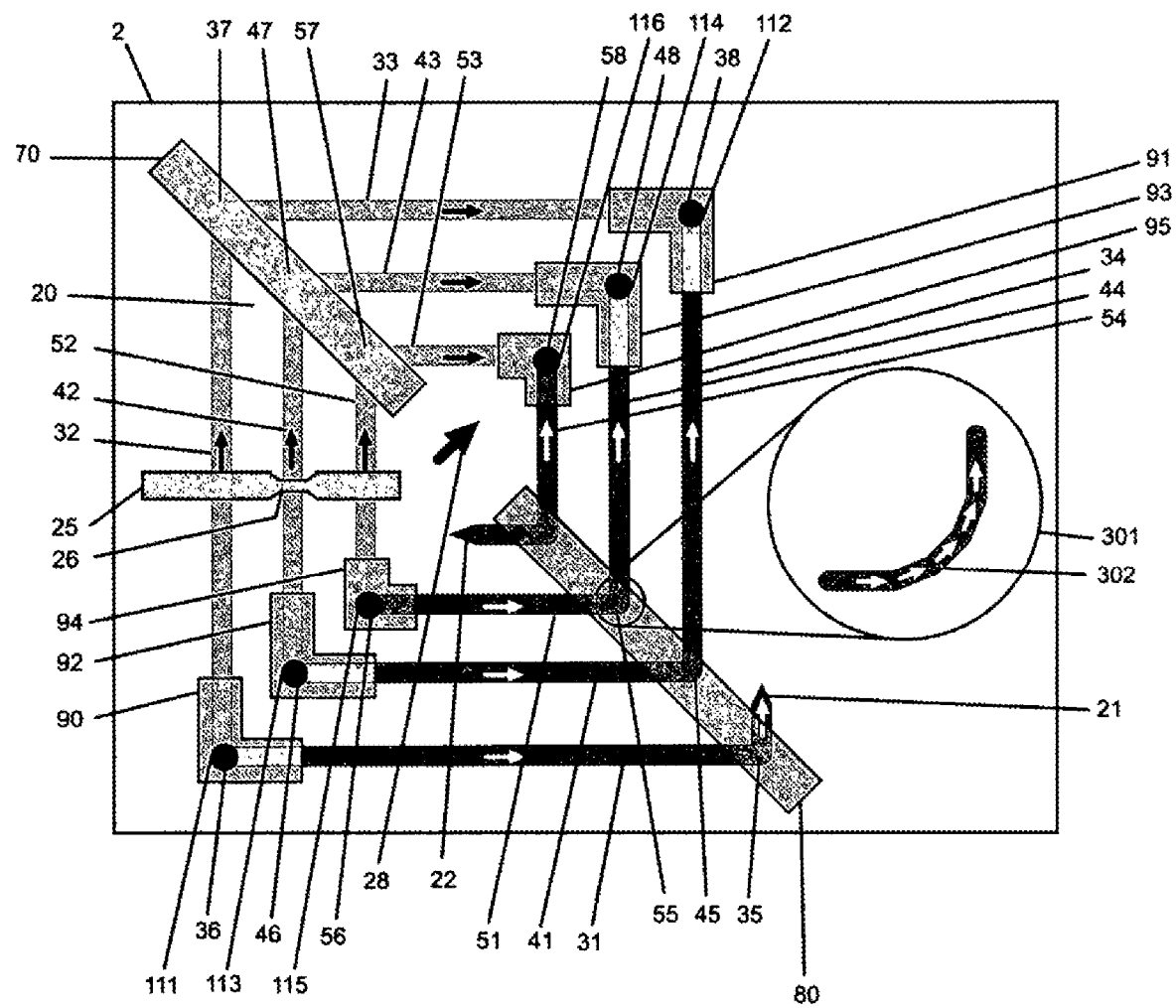
FIG. 5 shows a first general example of the design of the required sensor element having the "180° contacting;"
Figure 6:
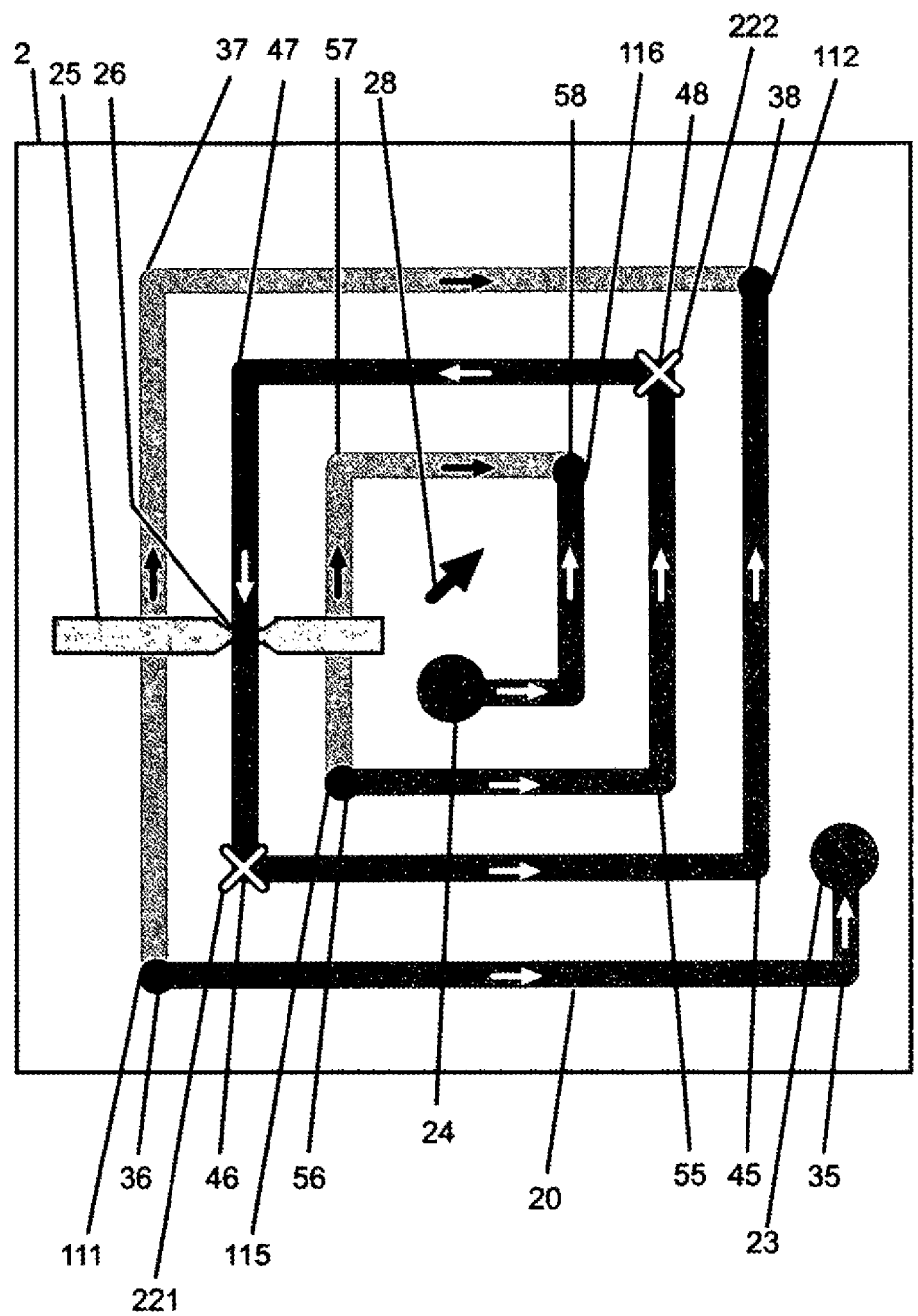
FIG. 6, based on a second general design of the required sensor element, shows the writing-in of a preferred provided magnetization pattern according to the invention.
Figure 7:
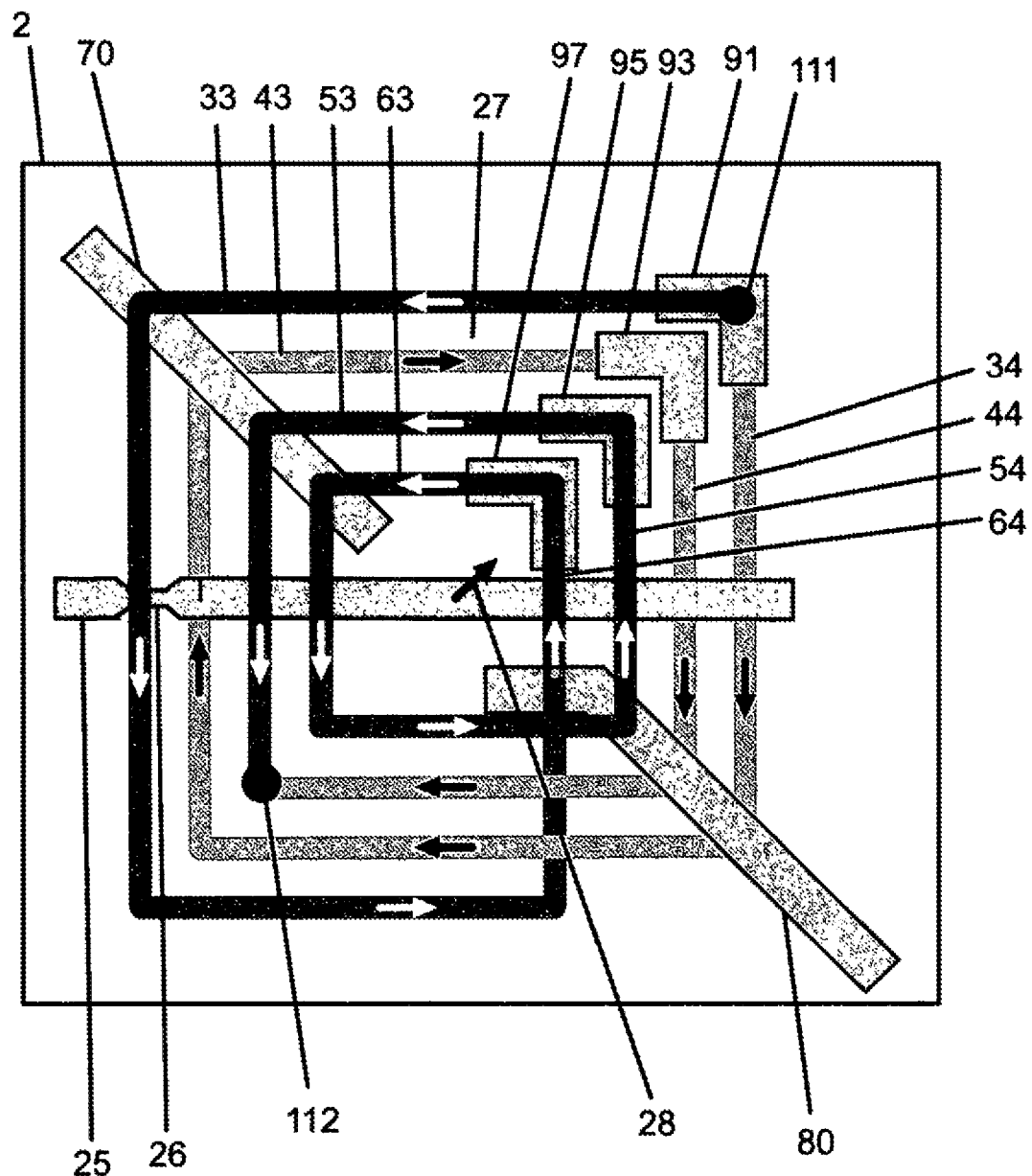
FIG. 7 shows a third general example of the design of a required sensor element having "360° contacting" according to the invention.

FIG. 4b shows the MP from FIG. 4a having a hysteresis of ±45°, wherein the hysteresis is symbolized by a gray rectangle. The ±45° hysteresis covers 90°, which is to say a quadrant. The quadrants are preferably disposed with respect to the spiral (FIG. 5 shows such a typical spiral) so that the field angle, which represents the "0° position" of the hysteresis, is perpendicular with respect to a web. In this way, the field angles representing the hysteresis limits are oriented toward the two DW positions that comprise this web. Due to this arrangement of the quadrants with respect to the square spiral, the four quadrants within a winding each represent a web, and the hysteresis represents each DW position on this web, including half of the abutting DW positions in which the DW predominantly remain from a time perspective. Thick vertical lines in FIG. 4b symbolize the DW positions from FIG. 4a, and thin vertical lines symbolize the DW positions, which are in the DW positions at the other end of the associated web. During regular, error-free operation, a DW traverses the web between two DW positions within a few 100 ns. DW positions within the web are symbolized by the gray rectangle. When this web forms part of a Wheatstone half bridge, the permissible signal levels in quadrants 1 and 2 are high levels or medium levels, symbolized by the light gray rectangle, and in quadrants 3 and 4 they are medium levels or low levels, symbolized by the dark gray rectangle (wherein the reference direction is located as shown in FIGS. 5 to 7).

Figure 4C:

FIG. 4c shows an MP including four domain walls in a position that, for example, represents the revolution zero. The revolution number zero is output by the read-out electronics. The angular separations in the MP are 180° between the DW on the outer left and the DW on the inner left, 540° between the DW on the inner left and the DW on the inner right, and 180° between the DW on the inner right and the outer right, totaling 900° between the outer domain walls. The domain walls are symbolized by rectangles, which include all DW positions on a web, corresponding to a permissible hysteresis of ±45°. Similarly to FIG. 4b, light gray rectangles symbolize high or medium levels, and dark gray rectangles symbolize medium or low levels of the Wheatstone half bridge.

Figure 4D:

FIG. 4d shows the MP from FIG. 4c after a cw revolution. All four domain walls have been transported further by respective four DW positions (quarter circles). The angular separations in the MP remain the same. This MP position represents revolution number 1. Revolution number one is output by the read-out electronics. Similarly to FIG. 4c, the domain walls are symbolized by light gray and dark gray rectangles.

Figure 4E:

FIG. 4e shows an MP including two domain walls having an angular separation of 900° at positions that are also occupied by the outer domain walls in FIG. 4c. When, in FIG. 4e, the initialized MP was the MP from FIG. 4c, two domain walls annihilated between the measurement of the MP from FIG. 4c and the measurement from FIG. 4e. Due to the angular separation of 900°, it is possible to ascertain the revolution number of zero in a plausible manner from the MP from FIG. 4e. In advantageous designs, the read-out electronics output the revolution number of zero and an error value. Similarly to FIG. 4c, the domain walls are symbolized by light gray and dark gray rectangles.

Figure 4F:

FIG. 4f shows an MP including two domain walls having an angular separation of 180°. When, in FIG. 4f, the initialized MP was the MP from FIG. 4c, two domain walls annihilated between the measurement of the MP from FIG. 4c and the measurement from FIG. 4f. Due to the angular separation of 180°, it is not possible to ascertain a revolution number from the MP from FIG. 4f in a plausible manner. In advantageous designs, the read-out electronics output an error value. Similarly to FIG. 4c, the domain walls are symbolized by light gray and dark gray rectangles.

Figure 4G:

FIG. 4g shows an MP including four domain walls having an angular separation of 1260° between the outer DW, and of 180° between the DW on the outer right and the DW on the inner right. Based on these two domain walls, it is possible to ascertain revolution number of one in a plausible manner. In advantageous designs, the read-out electronics output the revolution number of one and an error value. Compared to the MP in FIG. 4c, the DW on the outer left is in the same position. It has not been shifted cw by 360° (4 DW positions), like the other three domain walls, but was pinned during the cw revolution. Similarly to FIG. 4c, the domain walls are symbolized by light gray and dark gray rectangles.

Figure 4H:

FIG. 4h shows an MP including four domain walls having an angular separation of 900° between the outer DW, and of 180° between the DW on the inner left and the DW on the outer left. Based on these two domain walls, it is possible to ascertain a revolution number of one in a plausible manner. In advantageous designs, the read-out electronics output the revolution number of one and an error value. Compared to the MP in FIG. 4c, the DW on the inner right is in the same position. It has not been shifted cw by 360° (4 DW positions), like the other three domain walls, but was pinned during a cw revolution. Similarly to FIG. 4c, the domain walls are symbolized by light gray and dark gray rectangles.

Figure 4I:

FIG. 4i shows an MP including six DW having an angular separation of 900° between the outer domain walls, and of 180° between two respective neighboring domain walls. Based on the two outer domain walls, it is possible to ascertain a revolution number of zero in a plausible manner. In advantageous designs, the read-out electronics output the revolution number of zero and an error value. Compared to the MP in FIG. 4c, two domain walls have been added within the original MP by way of DW nucleation. Similarly to FIG. 4c, the domain walls are symbolized by light gray and dark gray rectangles.

Figure 4J:

FIG. 4j shows an MP including six DW having an angular separation of 1260° between the outer DW, and of 180° between the DW on the inner left and the DW on the outer left, and of 540° between the DW on the inner left and the DW on the center left, and of 180° between the DW on the center left and the DW on the center right. Based on these four DW, which assume the positions of the four DW in FIG. 4c, it is possible to ascertain a revolution number of zero in a plausible manner. In advantageous designs, the read-out electronics output the revolution number of zero and an error value. Compared to the MP in FIG. 4c, two DW have been added outside the original MP by way of DW nucleation. Similarly to FIG. 4c, the domain walls are symbolized by light gray and dark gray rectangles.

Figure 4K:

FIG. 4k shows an MP including six domain walls having an angular separation of 1620° between the outer domain walls. Compared to the MP in FIG. 4a, two domain walls have been added by way of DW nucleation outside the original MP, having an angular separation of 540° and 720° with respect to the DW on the outer right in FIG. 4a, which is now the DW on the center right in the MP. Due to the angular separations in the MP of FIG. 4i, it is not possible to ascertain a revolution number in a plausible manner. In advantageous designs, the read-out electronics in this case output only an error value. Similarly to FIG. 4c, the domain walls are symbolized by light gray and dark gray rectangles.

The following FIGS. 5 to 7 show a top view of exemplary actual sensor element geometries that enable the operation using MP having a constant DW number. These examples schematically show: a three-turn spiral having two tips having 180° contacting (FIG. 5), a three-turn spiral including two DWG (FIG. 6), and a four-turn, square loop having 360° contacting according to the invention (FIG. 7). For the sake of improved clarity, the exemplary revolution sensors are only shown with the details that are described hereafter with respect to the particular figure.

FIG. 5 shows a design according to the invention of a revolution sensor 2. The sensor element in the example is to be a three-turn, square spiral 20, having pointed ends. The tip 21 is the end of the outer winding, and the tip 22 is the end of the innermost winding. The spiral is composed of a magnetic layer stack, which exhibits the GMR effect. The reference direction 28 is diagonal with respect to the square windings. The first, outermost winding is composed of webs 31, 32, 33 and 34, the second, center winding is composed of webs 41, 42, 43 and 44, and the third, innermost winding is composed of webs 51, 52, 53 and 54 (clockwise). Each web is positioned at an angle of 90° with respect to the following web. The connections between the webs are quarter circles or quarter circle-like polygonal lines 302 (shown in the enlarged circle 301), formed of the same layer stack as the aforementioned webs. These polygonal lines are the "corners" of the square spiral and, at the same time, the domain wall positions (DW positions). The first, outermost winding includes the DW positions 35, 36, 37 and 38, the second winding includes the DW positions 45, 46, 47 and 48, and the third winding includes the DW positions 55, 56, 57 and 58. The spiral is provided with electrical contacts in the "180° contacting pattern." There is a shared GND contact 70 at the top left, a shared VCC contact 80 at the bottom right, three center contacts 91, 93 and 95 at the top right and three center contacts 90, 92 and 94 at the bottom left, and a conductor 25 having a constriction 26 for initializing the sensor element. The magnetization state of the sensor element is read out by way of potential measurement using six Wheatstone half bridges. On the bottom left, there are the three half bridges with the center contacts 90, 92 and 94:

The Wheatstone half bridge W1-1 is formed by the webs 31 and 32 together with the center contact 90, the GND contact 70 and the VCC contact 80.
The Wheatstone half bridge W2-1 is formed by the webs 41 and 42 together with the center contact 92, the GND contact 70 and the VCC contact 80.
The Wheatstone half bridge W3-1 is formed by the webs 51 and 52 together with the center contact 94, the GND contact 70 and the VCC contact 80.

On the top right, there are the three half bridges with the center contacts 91, 93 and 95:

The Wheatstone half bridge W1-2 is formed by the webs 33 and 34 together with the center contact 91, the GND contact 70 and the VCC contact 80.
The Wheatstone half bridge W2-2 is formed by the webs 43 and 44 together with the center contact 93, the GND contact 70 and the VCC contact 80.
The Wheatstone half bridge W3-2 is formed by the webs 53 and 54 together with the center contact 95, the GND contact 70 and the VCC contact 80.

The sensor element 2 is initially completely filled with six DW here (for example, following a field pulse having a field strength exceeding the nucleation field strength of the sensor element 2):

In the first, outermost winding, the DW 111 is located in the DW position 36, and the DW 112 is located in the DW position 38.
In the second, center winding, the DW 113 is located in the DW position 46, and the DW 114 is located in the DW position 48.
In the third, innermost winding, the DW 115 is located in the DW position 56, and the DW 116 is located in the DW position 58.

The three half bridges are at the center potential due to these DW positions and the position of the reference direction 28. The magnetization direction in the ccw direction is shown in dark gray, and the magnetization direction in the cw direction is shown in light gray. Additionally, the magnetization direction is identified for each web by an arrow. The reference direction 28 of the GMR layer stack is diagonal with respect to the square spiral and is oriented from the bottom left to the top right.

The magnetization pattern including six DW shown in FIG. 5 is not yet suitable for counting revolutions. First, DW still have to be deleted. The otherwise identical deletion procedure is to be described based on a spiral having two domain wall generators at the ends, as it is shown in FIG. 6, so as to address a further design option of the actual sensor element here.

FIG. 6 shows a variant of the sensor element 2. The sensor element 2 is a three-turn, square spiral 20, having domain wall generators 23 and 24 positioned at the ends thereof. It carries a magnetization pattern (MP) including 2 DW gaps (DWG) 221 and 222, visualized by a respective cross. Prior to the deletion, the DW 113 and DW 114 (no longer shown in FIG. 6, see FIG. 5 in this regard) were located at the positions of the DWG 221 and DWG 222. Without going into detail, the initialization takes place in two steps, for example:

1. Either nucleation of DW using a magnetic field pulse having a field strength above the nucleation field strength, having a field direction along the spiral diagonal (for example, from the bottom left to the top right), or rotation of the magnetic field of the sensor system by at least n+1 revolutions in the case of an n-turn spiral in the cw direction or the ccw direction (4 revolutions here). In this way, the spiral is completely filled with DW by the domain wall generator DWG 23 (or by the DWG 24).
2. DW annihilation of two DW beneath the constriction 26 of the conductor 25 by way of a sufficiently large Oersted field, whereby two DW gaps DWG 221 and DWG 222 are created, which are then transported into the desired zero position.

Instead of the tips 21 and 22 of the sensor element shown in FIG. 5, the square spiral 20 in FIG. 6 is provided with two domain wall generators (DWG) 23 and 24 at the ends. For the determination of the revolution number, the positions of the DW 112 and/or of the DW 115 in the measured SLS are ascertained. The electrical contacting for a spiral including two DWG is always the "180° contacting" (see FIG. 5) and was omitted in FIG. 6 for the sake of better clarity. The reference direction 28 of the GMR layer stack is diagonal with respect to the square spiral and is oriented from the bottom left to the top right.

FIG. 7 shows a further design according to the invention of a revolution sensor 2, composed of a four-turn, closed loop 27. In the example, an MP including two DW 111 and DW 112 having an angular separation of 540° was initialized by way of the conductor 25 comprising the constriction 26. The reference direction 28 of the GMR layer stack is diagonal with respect to the square spiral here as well, and is oriented from the bottom left to the top right. Electrical contact with this loop, however, is made analogously to the spiral in FIG. 5 by way of "360° contacting", comprising a shared GND contact 70, a shared VCC contact 80 and four center contacts 91, 93, 95 and 97, which are located in a half to the right of the line from the VCC contact to the GND contact. The magnetization state of the sensor element is read out by way of potential measurement using four Wheatstone half bridges:

The Wheatstone half bridge WHB1 is formed by the webs 33 and 34 together with the center contact 91, the GND contact 70 and the VCC contact 80.

The Wheatstone half bridge WHB2 is formed by the webs 43 and 44 together with the center contact 93, the GND contact 70 and the VCC contact 80.

The Wheatstone half bridge WHB3 is formed by the webs 53 and 54 together with the center contact 95, the GND contact 70 and the VCC contact 80.

The Wheatstone half bridge WHB4 is formed by the webs 63 and 64 together with the center contact 97, the GND contact 70 and the VCC contact 80.

The four Wheatstone half bridges WHB1 to WHB4, at the same time, correlate with the windings W1 to W4.

Figure 8:
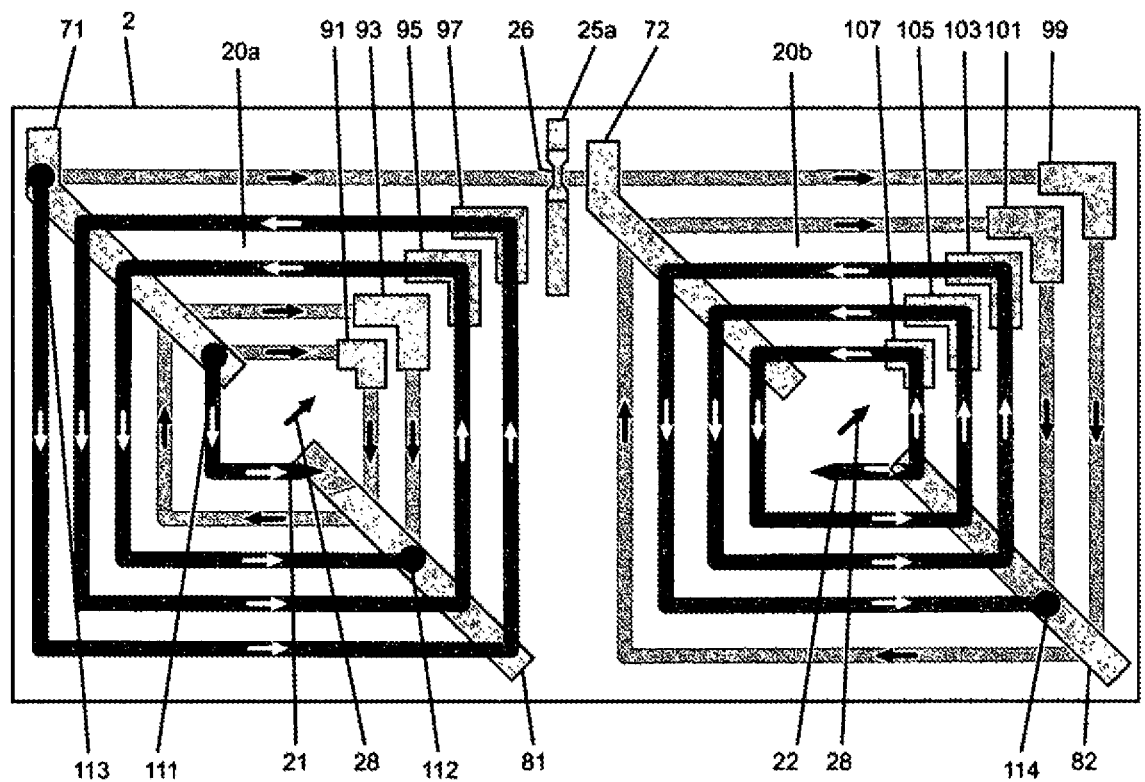
FIG. 8 shows a fourth general example of the design of the required sensor element having a division according to the invention into two logical regions of the sensor element.

FIG. 8 shows a further exemplary design according to the invention of a sensor element 2 for measuring revolutions. In the example, the sensor element 2 is to be composed of two sub-spirals 20a and 20b, comprising the tips 21 and 22, and using four respective windings and "360° contacting," comprising the contacts 71 (GND), 81 (VCC), 91, 93, 95 and 97 (center contacts) on the sub-spiral 20a, and 72 (GND), 82 (VCC), 99, 101, 103, 105 and 107 (center contacts) on the sub-spiral 20b, four domain walls DW 111, DW 112, DW 113 and DW 114 were initialized. In this design, these four domain walls form two logical magnetization patterns including two respective domain walls: DW 111 and the DW 112 form an MP in the sub-spiral 20a, and DW 113 and DW 114 form a second MP. In the illustrated example, each MP is located in the "zero position" and can be moved cw by three revolutions. The angular separation between DW 111 and DW 112, and between DW 113 and DW 114, is 540°, respectively, and the angular separation between DW 112 and DW 113 is 900°. Due to these two logical MPs, this design becomes a revolution counter having redundant revolution counting on a chip, which is able to count three revolutions. The conductor 25 comprising the constriction 26 is used for the initialization. The reference direction 28 of the GMR layer stack is oriented diagonally with respect to the square spirals and is oriented from the bottom left to the top right. The measurement results of the two sub-spirals are evaluated by the read-out electronics (6) (see FIG. 1). Only when the read-out electronics ascertain the same revolution number from the measured sub-SLS of the two sub-spirals does the measurement supply a doubly redundant result. In the case of an error event in a spiral, the read-out electronics can always ascertain the revolution number from the SLS of the spiral in which the read-out electronics identify a valid state (agreement with a target value pattern). The other SLS results in an error value. With a suitable MP, for example the MP from FIG. 4c, it is then still possible to ascertain the revolution number despite an error state (agreement with an error target value pattern), so that the revolution number is then also doubly redundantly ascertained, despite the error state.

Figure 9:
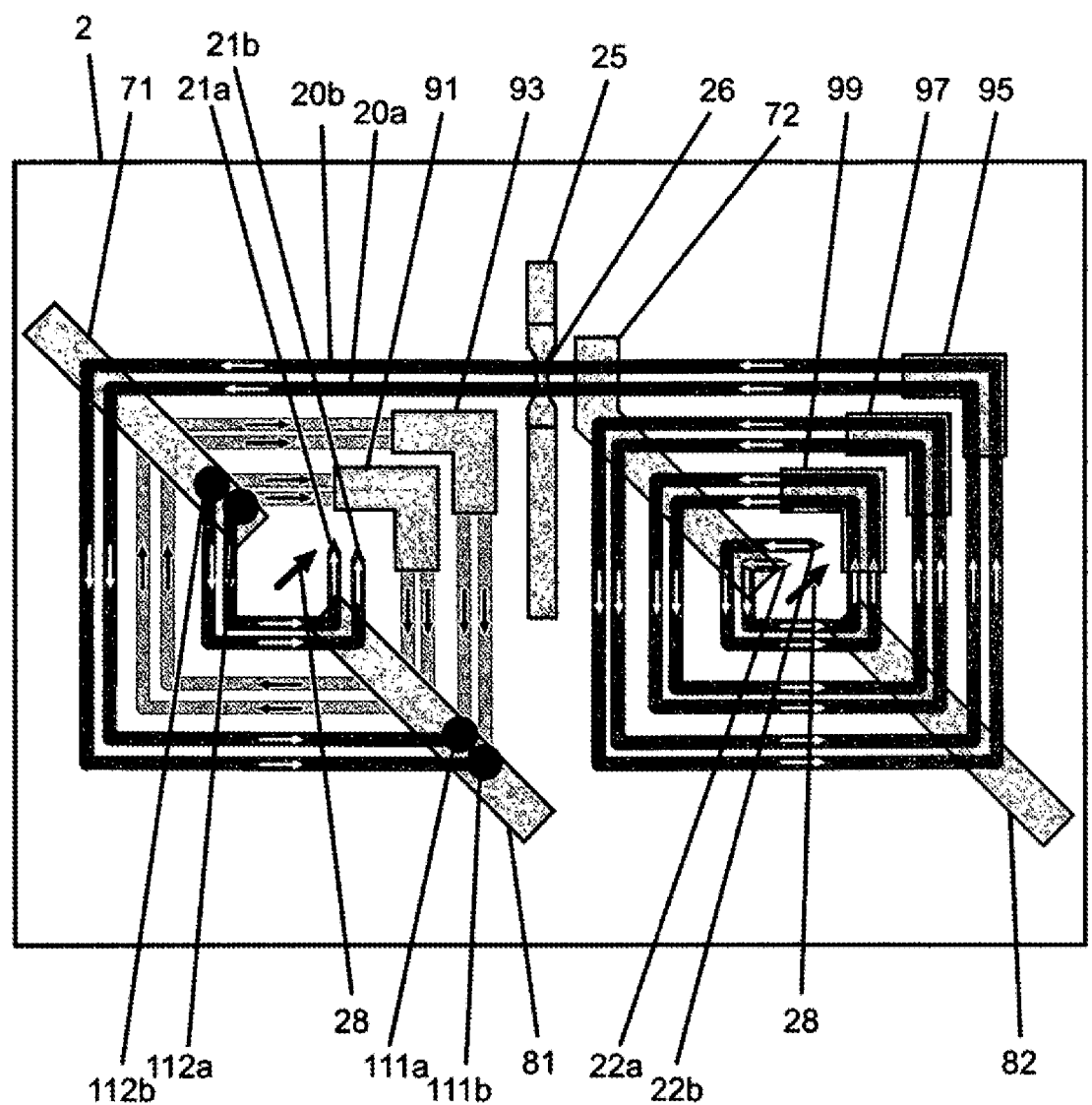
FIG. 9 shows a fifth general example of the design of the required sensor element having an arrangement of double webs according to the invention.

FIG. 9 shows a further exemplary design option according to the invention of a sensor element for measuring three revolutions. Two spirals 20a (inner spiral) and 20b (outer spiral) guided inside one another, comprising the tips 21a and 22a, or 21b and 22b, and having four respective windings and shared 360° contacting, comprising the contacts 71 (GND), 81 (VCC), 91, 93 (center contacts) on the sub-spirals on the left, and 72 (GND), 82 (VCC), 95, 97 and 99 (center contacts) on the sub-spirals on the right, form a revolution counter, and the double redundancy is obtained here by the parallel guided double spiral. The reference direction 28 of the GMR layer stack is diagonal with respect to the square spiral and is oriented from the bottom left to the top right. The conductor 25 comprising the constriction 26 is used for the initialization. In the example, an MP including a respective DW pair DW 111a and DW 112a in the spiral 20a, and DW 111b and DW 112b in the spiral 20b, having a respective angular separation of 540° is initialized. In the valid counting operation, this sensor element supplies the signal levels high (100% level), medium (50% level) and low (0% level). In the case of a DW pinning event, which results in a change in the angular separation between two DW, two new levels are created, these being the 75% level and 25% level, which indicate to the read-out electronics that an error has occurred. The read-out electronics must be able to detect these levels without a doubt. They can nonetheless ascertain a valid revolution number based on the SLS having the 75% level or 25% level, since a DW pair was transported in an error-free manner in a spiral (for example, the spiral 20a). This means that, for example, a 75% level is present in the SLS instead of a high level, and a 25% level is present in the SLS instead of a low level. The target value patterns and error target value patterns that are kept available are adapted to the five signal levels of this sensor element.

Figure 10A:
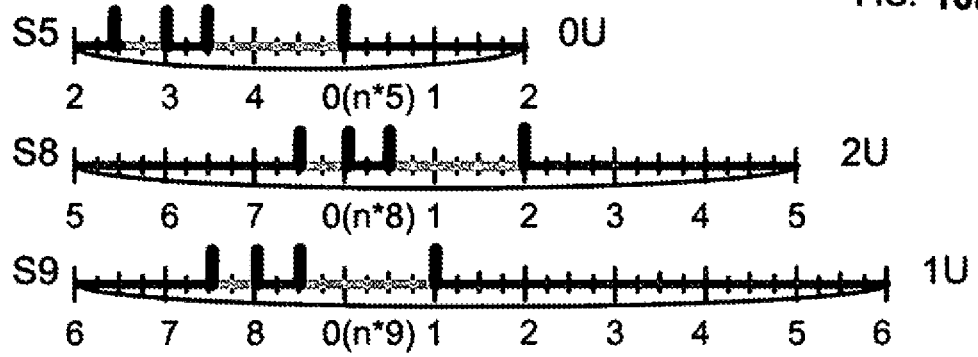
FIGS. 10a and 10b schematically show the redundant revolution number determination in a sensor element comprising three coprime individual loops during regular operation and with the occurrence of an error state.
Figure 10B:
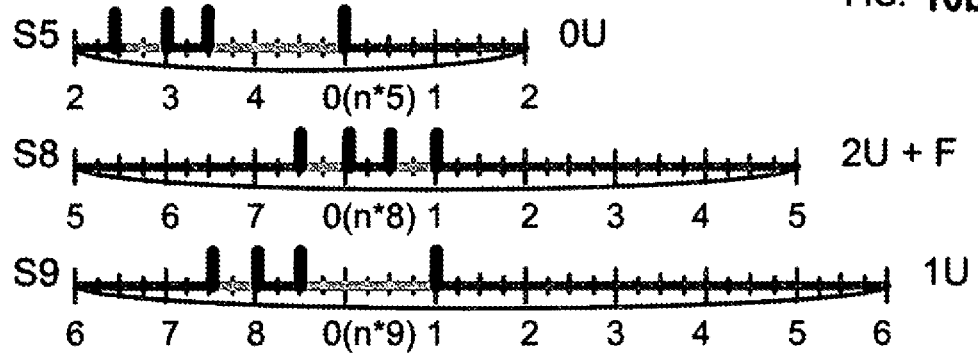

FIGS. 10a, 10b schematically show a design according to the invention of a sensor element for counting 40 revolutions (U) in an exemplary application. The sensor element comprises three loops having the coprime maximum revolution numbers 5 (S5), 8 (S8) and 9 (S9). In the top view, these are square loops, as is shown by way of example in FIG. 7, which are shown in a space-saving manner here. The loops, DW positions and domain walls are symbolized as in FIG. 3d. For non-redundant revolution counting, the loops S5 and S8 are required, which together count up to 40 revolutions: 5U*8U=40U. By adding loop S9 to the redundant revolution counting, there are three combinations consisting of two loops each, which can count at least 40 revolutions.

Byway of example, for the revolution number 10U, FIG. 10a shows the MP positions in the loops S5 (individual loop revolution number: 0U), S8 (individual loop revolution number: 2U), and S9 (individual loop revolution number: 1U) using a redundant MP including four DW having angular separations of 180° between the DW on the outer left and the DW on inner left, 180° between the DW on inner left and the DW on the inner right, and 540° between the DW on the inner right and the DW on the outer right. The position of the DW on the outer right represents the respective individual loop revolution number here.

For each of the three combinations of the loops (S5+S8), (S5+S9) and (S8+S9), the read-out electronics ascertain the respective revolution number 10U for the loop combination from the individual loop revolution numbers. In total, the revolution number is triply redundantly ascertained. This is either such that, for each loop combination, the associated revolution number of the loop combination is stored (tabular) for each combination of individual loop revolutions numbers, or such that this is calculated. In an application counting 40 revolutions, the individual loop revolution number
- 0U for the loop S5 represents the revolution numbers 0U, 5U, 10U, 15U, 20U, 25U, 30U, 35U and 40U (generally, n*5U);
- 2U for the loop S8 represents the revolution numbers 10U, 18U, 26U and 34U (generally, m*8U+2U);
- 1U for the loop S9 represents the revolution numbers 10U, 19U, 28U and 37U (generally, k*9U+1U).

Due to the coprime nature of the loops among one another, there is always only exactly one agreement for each combination of individual loop revolution numbers, which is the revolution number of the combination. Here, this is the revolution number 10U.

So as to create the target value SLS, the correct MP positions or the correct positions of the decisive DW must be calculated. The correct DW position is the remainder from the division of the revolution number (10U) by the maximum revolution number of the loop (5U, 8U or 9U here):

S5: 0U (10/5=2+remainder 0),
S8: 2U (10/8=1+remainder 2), and
S9: 1U (10/9=1+remainder 1)

FIG. 10b shows the MP positions for the counted revolution number 10U when, in the loop S8, the DW on the outer right was pinned during a revolution and, compared to FIG. 10a, the angular separation with respect to the DW on the inner right thereby decreased from 540° to 180°, and that with respect to the DW on the outer left thereby decreased from 900° to 540°. Based on this angular separation of 540°, the read-out electronics detect that the loop S8 is in an error state (F). Due to the angular separation of 180° between the DW on the outer left and the DW on the inner left, which is unchanged compared to FIG. 10a, the read-out electronics detects the revolution number 2U for the loop S8 in a plausible manner.

S5: 0U (10/5=2+remainder 0),
S8: F+2U (error state and 10/8=1+remainder 2) and
S9: 1U (10/9=1+remainder 1)

Based on the error state of the loop S8, the read-out electronics ascertain the revolution number 10U using the valid values of the loops S5 and S9 (S5:0U and S9:1U). Due to the redundant MP including four DW, the read-out electronics are able to ascertain and utilize the individual loop revolution number 2U of the loop S8, despite the error state of the same (F), and consequently also ascertain the respective revolution number 10U for the combinations of the loops (S5+S8) and (S8+S9), in an overall triply redundant manner, due to the redundant magnetization patterns including four domain walls in each individual loop.

FIG. 11 shows the MP in a five-turn spiral including one DWG. In the top view, this is a square spiral, similar to the spiral in FIG. 6, in which one DWG was replaced by a tip. The spiral is again shown in a space-saving manner here. The spiral, the DWG, the DW positions, the DW and the DWG are symbolized as in FIG. 3b. This spiral is a sensor element as essentially known from the prior art (FIGS. 11a to 11e), which is combined with the read-out electronics according to the invention so as to detect error states. FIGS. 11f to 11h show new variants over the prior art, which are more sensitive in the detection of the DW nucleation and DW annihilation error states than the spirals in FIG. 11a to FIG. 11e known from the prior art. With each half revolution, the DWG injects a DW into the spiral, so that, during error-free operation, a DW chain can be positioned in the spiral from the DWG to the tip of the spiral. The DW on the outer right is the DW that was transported the furthest into the spiral and, in this design, represents the maximally ascertainable revolution number.

FIG. 11a shows the five-turn spiral including six domain walls. The DW on the outer right represents revolution number 3.

FIG. 11b shows the five-turn spiral including four domain walls and two DWG, symbolized by a respective cross. The two DWG on the outer right were created by annihilation of the two domain walls on the outer right in FIG. 11a. The MP in FIG. 11b represents revolution number 2. The error state of the DW annihilation is not identified.

FIG. 11c shows the five-turn spiral including four domain walls and two DWG, symbolized by a respective cross. The two DWG within the DW chain were created by annihilation of the two domain walls in the center in the MP of FIG. 11a. The MP in FIG. 11c represents revolution number 3. The error state (F) of the DW annihilation is identified.

FIG. 11d shows the five-turn spiral including ten DW. The MP in FIG. 11e represents revolution number 5. It is also identical to the MP following DW nucleations, in which the spiral is completely filled with DW. This error state (F) is thus not identified.

FIG. 11e shows the five-turn spiral in which, due to the mechanical end stop, only four revolutions can be counted. This fifth winding (5) is excluded from regular counting operation and is always DW-free, so as to always be able to detect DW nucleation in this winding. The MP including ten DW in FIG. 11e was thus created by way of DW nucleations, in which the spiral is completely filled with DW. This error state (F) is identified by the two DW in winding (5), which do not exist during regular counting operation, this being counting up to the revolution 4.

FIG. 11f shows a variation of the five-winding spiral from FIG. 11e in which the fifth winding has wider webs. In this way, DW first nucleate in the winding (5). If only two DW nucleate in this winding, it is still possible to ascertain the revolution number in a plausible manner. The MP in FIG. 11f indicates revolution number 2 and the error state of the DW nucleation in winding (5) in a plausible manner.

FIG. 11g shows a variation of the five-winding spiral from FIG. 11f in which the first winding has narrower webs. In this way, DW have a higher probability of pinning in winding (0) than in the other windings. Due to the mechanical end stop, this winding is excluded from regular counting operation and is always filled with two DW, so as to always detect the possible DW pinning error state with a subsequent DW annihilation in winding (0). The MP in FIG. 11h represents revolution number 1.

FIG. 11h shows the MP from FIG. 11g after two DW annihilated in winding (0). This error state (F) is identified. The MP in FIG. 11g represents revolution number 1 in a plausible manner and, at the same time, indicates the DW annihilation error state (F) in winding (0).

While all assemblies essential to the invention are provided within the actual revolution counter, which is enclosed in a frame-like manner in FIG. 1 and denoted by reference numeral 1a, FIGS. hereafter shall illustrate the broad field of application of the solution according to the invention.

Figure 12:
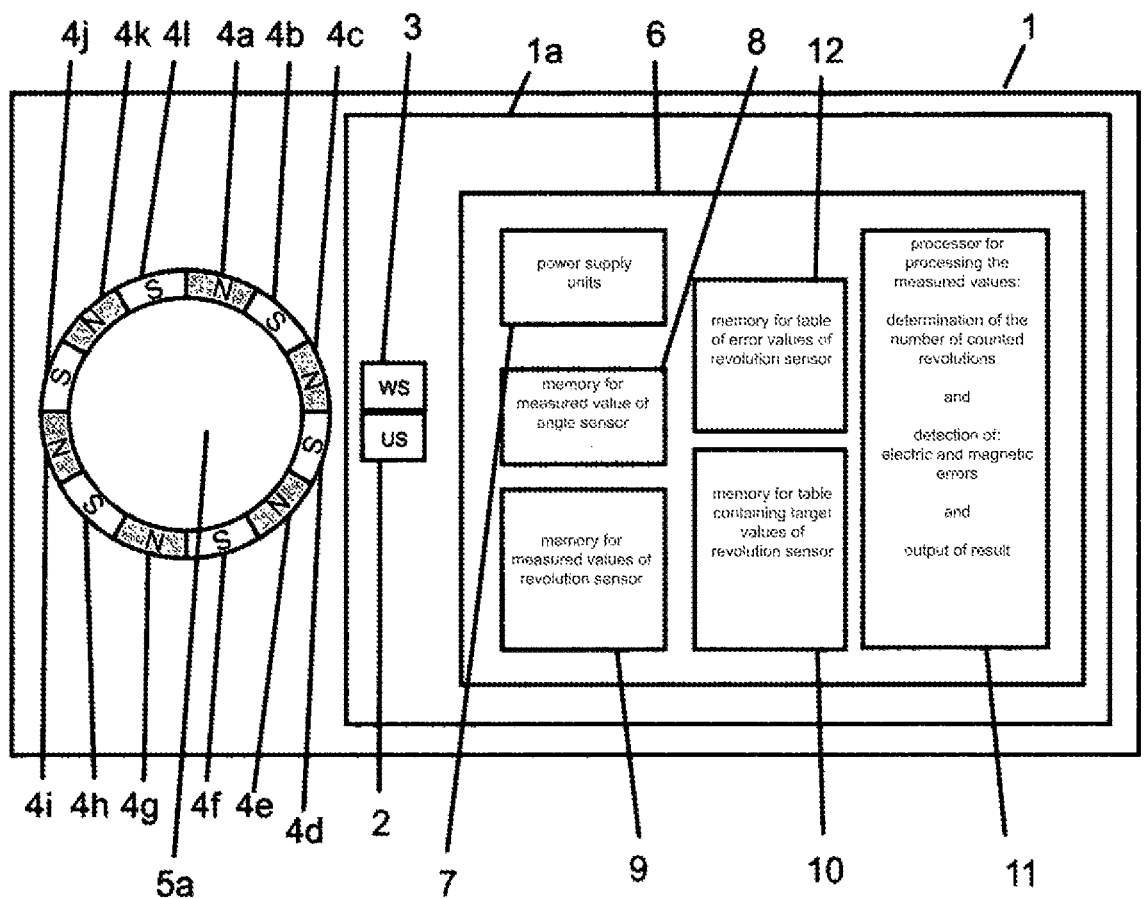
FIG. 12 shows a revolution counter according to FIG. 1 combined with a magnet wheel.

FIG. 12, for example, shows the revolution counter 1a from FIG. 1 combined with a magnet wheel 5a comprising magnetic poles 4a to 4l instead of a magnet 4 on a shaft 5 according to FIG. 1.

When the magnet wheel 5a is rotated, it generates a magnetic rotating field at the location of the angle sensor WS 3 and of the revolution sensor US 2 which moves the domain walls of the magnetization pattern in the sensor element 2. Each magnet wheel position thus corresponds to an angle sensor measured value and a revolution counter measured value. The revolution counter counts the number of the magnetic pole pairs that are moved past. This is analogous to the counting of revolutions of the magnet 4 according to FIG. 1.

Figure 13:
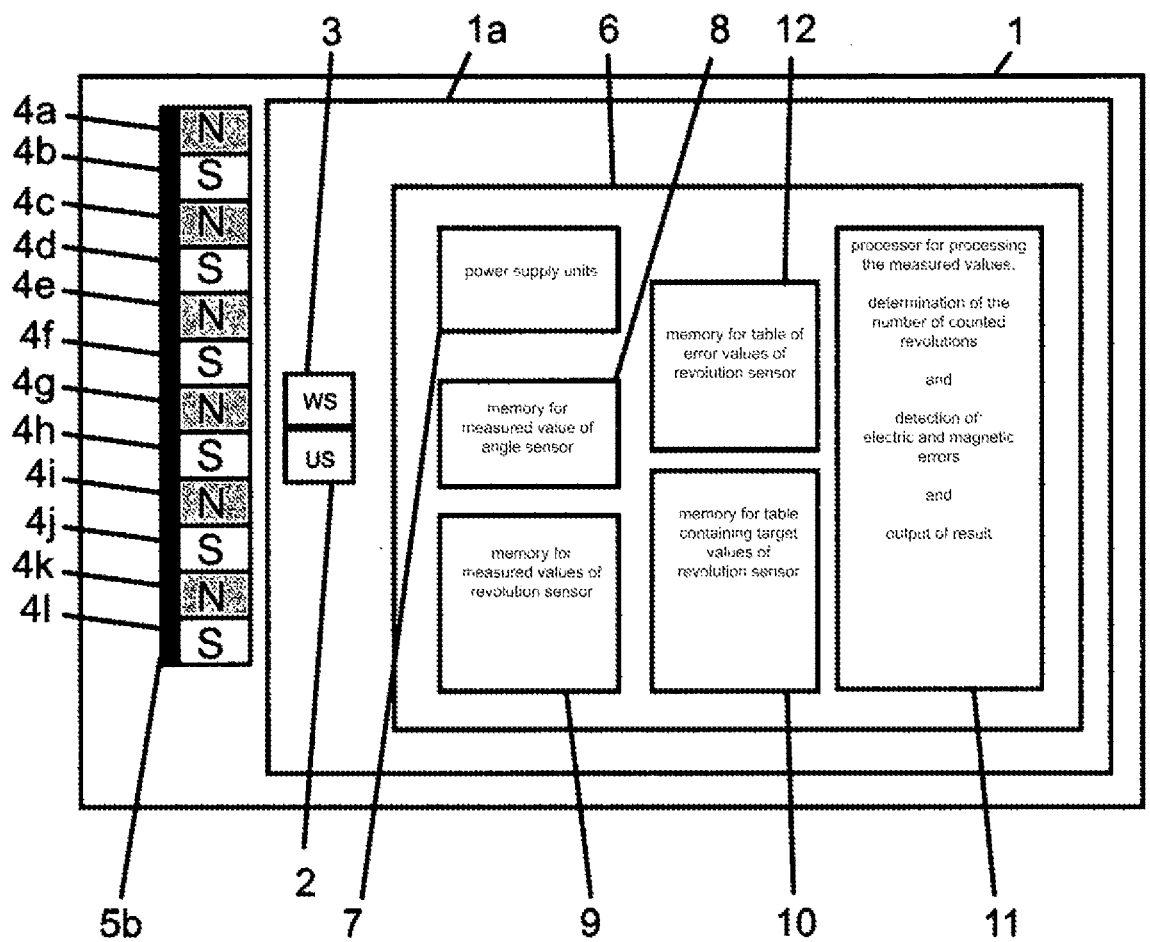
FIG. 13 shows a revolution counter according to FIG. 1 combined with a linear scale.

FIG. 13 shows the revolution counter 1a from FIG. 1 combined with a linear scale 5b comprising magnetic poles 4a to 4l instead of a magnet 4 on a shaft 5 according to FIG. 1. The linear scale 5b comprising twelve magnetic poles in the example (6 magnetic north poles alternatingly with 6 magnetic south poles) 4a to 4l also represents other linear a gauge having more or fewer magnetic poles. When the scale 5b is moved past relative to the revolution counter 1a, the scale generates a magnetic rotating field at the location of the angle sensor WS 3 and of the revolution sensor US 2 which moves the domain walls of the impressed magnetization pattern in the sensor element 2. Each scale position thus corresponds to an angle sensor measured value and a revolution counter measured value. The revolution counter counts the number of the magnetic pole pairs that are moved past. This is analogous to the counting of revolutions of the magnet 4 according to FIG. 1.

Figure 14A:
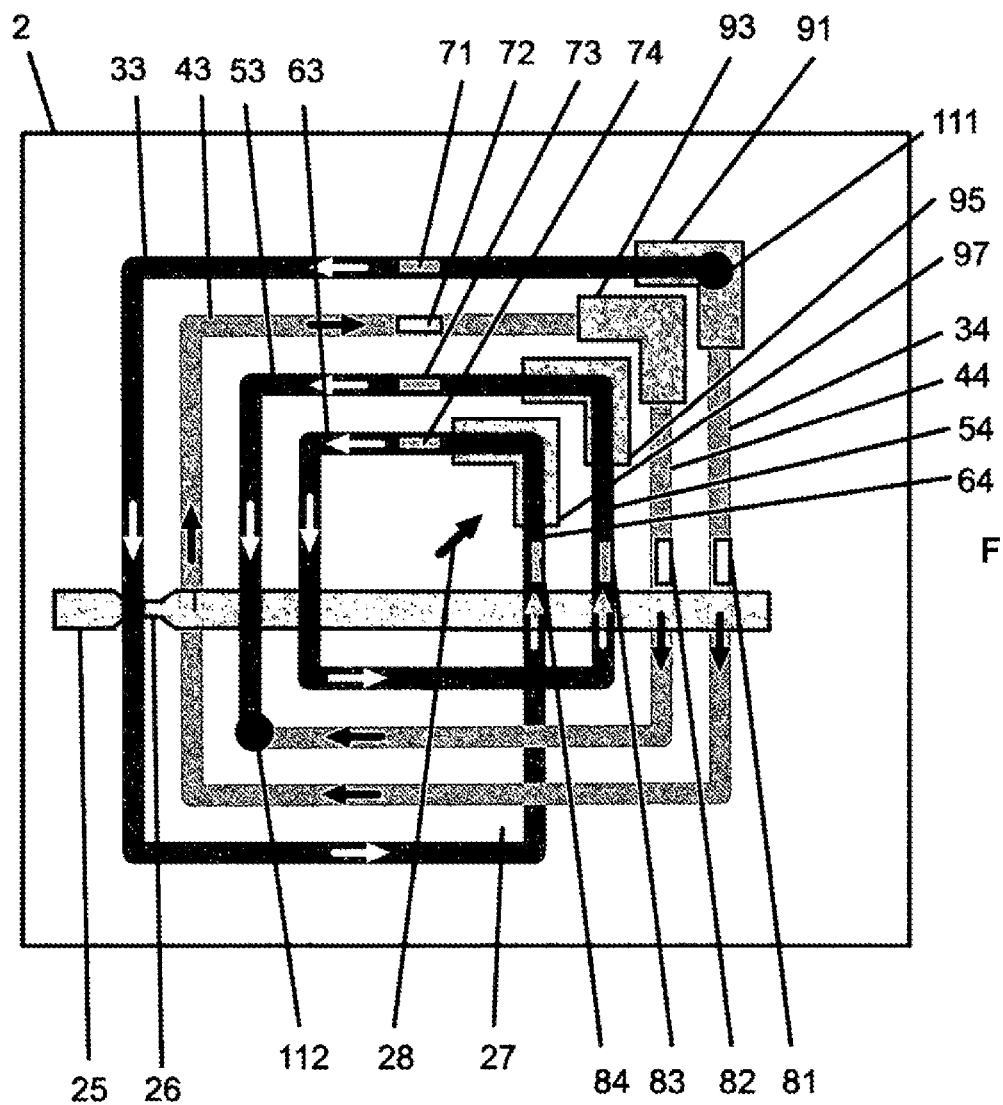
FIGS. 14a and 14b, by way of example, show an embodiment according to FIG. 7, comprising, in this case, TMR contacts and having 360° contacting.

Finally, FIGS. 14a+b, by way of example, show the read-out of a sensor element 2 comprising TMR contacts having "360° contacting." The spiral 27 is made of a soft magnetic material, such as permalloy, in this case.

FIG. 14a shows an exemplary four-turn, closed loop 27 in a top view. The sensor element 2 is read out by way of potential measurements using four Wheatstone half bridges WHB1 to WHB4:

WHB1 is composed of the web 33 comprising the GND tunneling contact 71, and the web 34 comprising the VCC tunneling contact 81 and the center contact 91, which covers the quarter circle-shaped corner between the web 33 and the web 34 and parts of these webs.

WHB2 is composed of the web 43 comprising the GND tunneling contact 72, and the web 44 comprising the VCC tunneling contact 82 and the center contact 93, which covers the quarter circle-shaped corner between the web 43 and the web 44 and parts of these webs.

WHB3 is composed of the web 53 comprising the GND tunneling contact 73, and the web 54 comprising the VCC tunneling contact 83 and the center contact 95, which covers the quarter circle-shaped corner between the web 53 and the web 54 and parts of these webs.

WHB4 is composed of the web 63 comprising the GND tunneling contact 74, and the web 64 comprising the VCC tunneling contact 84 and the center contact 97, which covers the quarter circle-shaped corner between the web 63 and the web 64 and parts of these webs.

Figure 14B:
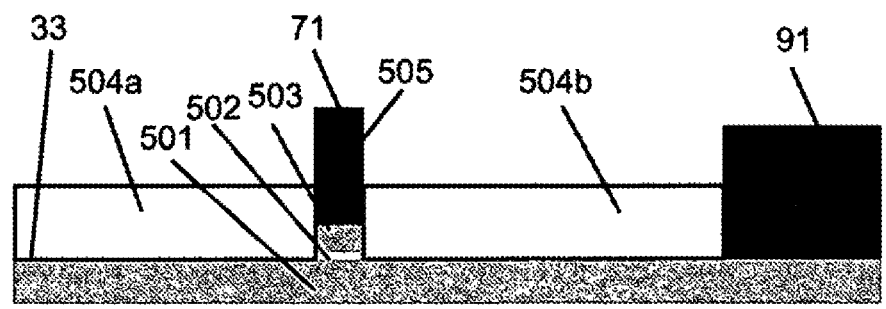

FIG. 14b, by way of example, shows the web 33 in a lateral section through FIG. 14a representatively for all webs comprising a tunneling contact. The web 33 is made of a soft magnetic material permalloy 501, and protected with an oxide layer 504a and 504b. The GND tunneling contact 71 is positioned in the web center. The tunneling contact comprises the permalloy layer 501, the tunnel barrier 502 (such as $Al_2O_3$ or MgO), a hard magnetic layer stack 503, into which the reference direction (28 in FIG. 14a) is written, and the gold electrode 505. The center contact 91, which is made of gold, is located directly on the permalloy 501 on the right of the web 33. The flow of current on the tunneling contact takes place from the electrode 505, through the hard magnetic layer stack, and through the barrier 502, into the permalloy 501. Typical TMR contacts reach changes in resistance of >100% between a parallel and an anti-parallel magnetization of the soft magnetic and the hard magnetic layers in the TMR contact, which is to say as a function of the respective position of the domain walls 111, 112. The initialization of the domain wall pattern according to the invention, and the evaluation and the determination of the present revolution number, in this example take place analogously to the proviso already described with respect to FIG. 5ff and consequently need not be repeated here.

Figure 15:
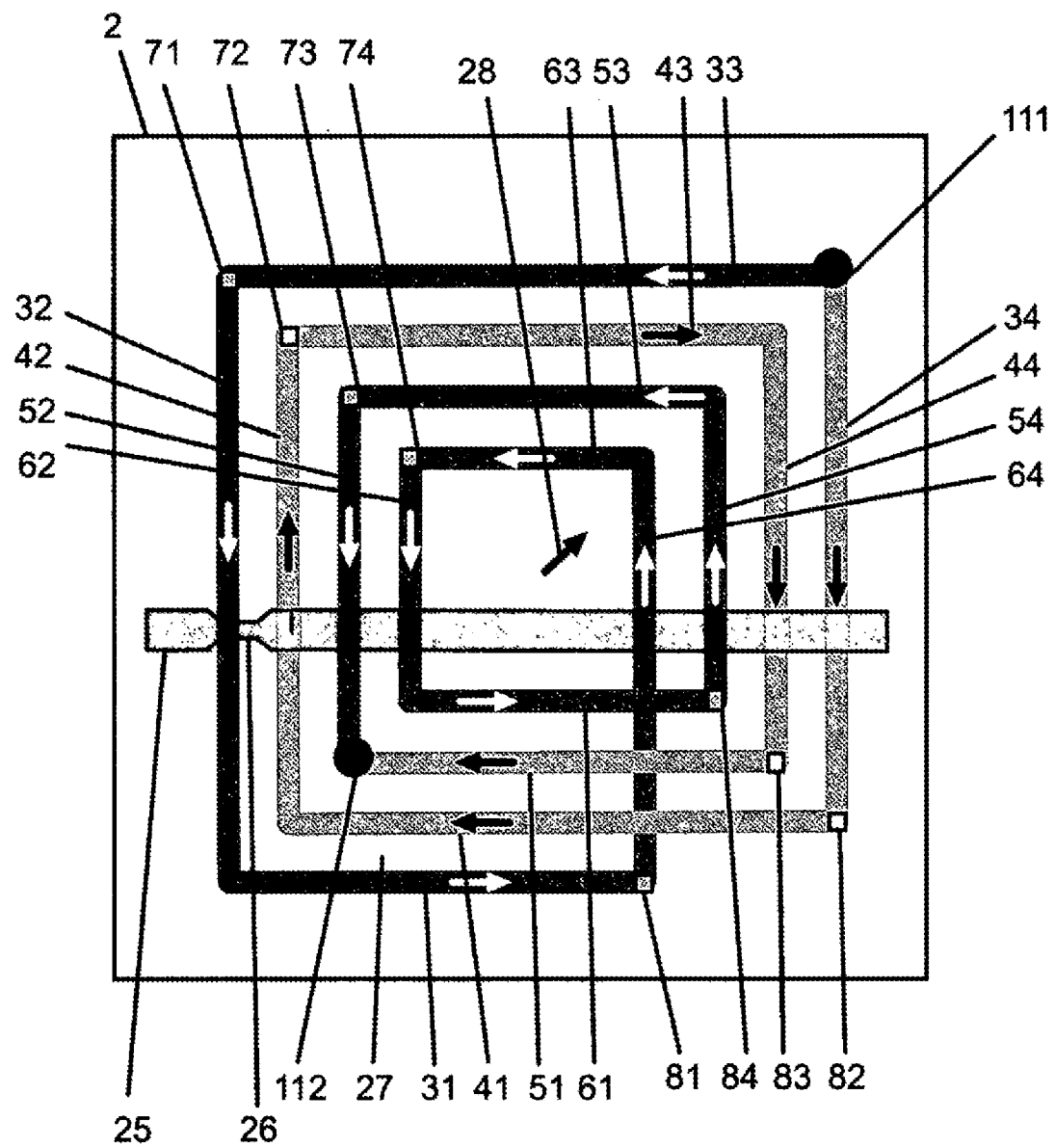
FIG. 15 shows the sensor element of FIG. 14a having an arrangement according to the invention of TMR contacts for resistance measurement.

FIG. 15 shows the revolution sensor from FIG. 14a having modified contacting in which the resistances are read out. This loop is electrically contacted with the GND contacts 71, 72, 73 and 74, and the VCC contacts 81, 82, 83 and 84, a respective GND contact and a respective VCC contact being located on one winding. So as to utilize the TMR effect, the VCC contacts, for example, must contact the respective soft magnetic layer, and the GND contacts must contact the respective hard magnetic layer (analogous to FIG. 14b, in which the center contact 91 contacts the soft magnetic layer 501, and the GND tunneling contact 71 contacts the hard magnetic layer), or vice versa. Deviating from FIG. 14, the contacts may be positioned on the webs, instead of over the corners, and preferably on opposing webs. For example, the VCC contacts 81, 82, 83 and 84 can be positioned on the webs 31, 41, 51 and 61, and the GND contacts 71, 72, 73 and 74 can be positioned on the webs 33, 43, 53 and 63.

The magnetization state of the sensor element is read out by way of resistance measurement of each individual winding here:

The outer, first winding W1 is formed by the webs 31, 32, 33 and 34 comprising the GND contact 71 and the VCC contact 81.

The second winding W2 is formed by the webs 41, 42, 43 and 44 comprising the GND contact 72 and the VCC contact 82.

The third winding W3 is formed by the webs 51, 52, 53 and 54 comprising the GND contact 73 and the VCC contact 83.

The fourth, innermost winding W4 is formed by the webs 61, 62, 63 and 64 comprising the GND contact 74 and the VCC contact 83.

In this example as well, the separation between the two neighboring domain walls DW 111 and DW 112 is 540°, as viewed in the cw direction.

All above-described specific embodiments illustrate the multivalency of the present invention, which can be applied both to previously known revolution sensors of the type in question, and to those newly proposed herein.

All features discernible from the description, the exemplary embodiments and/or the following drawings can be essential to the invention, both individually and in any arbitrary combination with each other.

LIST OF REFERENCE NUMERALS

1 revolution counter system
1*a* revolution counter
2 revolution sensor US
3 angle sensor WS
4 magnetic system
   4*a*, 4*c*, 4*e* 4*g*, 4*i* 4*k* magnetic north poles
   4*b*, 4*d*, 4*f*, 4*h*, 4*j*, 4*l* magnetic south poles
5 rotating shaft
5*a* magnet wheel
5*b* linear scale
6 electronics
7 power supply units
8 memory for the measured values of the angle sensor
8*a* measured value W8 of the angle sensor
9 memory for the measured values of the revolution sensor
9*a* table T9 containing measured values of the revolution sensor
10 memory for target values of the revolution sensor stored in tabular form
   10*a*-10*d* sub-tables containing target values for field angle quadrants 1 to 4
11 processing unit
12 memory for target value error SLS stored in tabular form
   12*a*-12*d* sub-tables containing target value error SLS for field angle quadrants 1 to 4
20 spiral
21, 22 pointed ends of a spiral
25 conductor for initializing a magnetization pattern
26 constriction in conductor 25
27 multiply-wound, closed loop
28 direction of the reference magnetization
31, 32, 33, 34 webs of the outermost, first winding
35, 36, 37, 38 DW positions in the outermost, first winding
41, 42, 43, 44 webs of the second winding
45, 46, 47, 48 DW positions in the second winding
51, 52, 53, 54 webs of the third winding
55, 56, 57, 58 DW positions in the third winding
63, 64 webs of the fourth winding
65 DW position in the fourth winding
70, 71, 72, 73, 74 GND contacts
80, 81, 82, 83, 84 VCC contacts
91, 93, 95, 97, 99 center contacts of the different windings
111-116 domain walls (DW)
221, 222 DW gaps
301 zoomed-in corner between web 51 and web 44
302 quarter circle-like polygonal line
400 flow chart
501 soft magnetic layer
502 tunnel barrier
503 hard magnetic layer stack
504*a* insulating layer
504*b* insulating layer
505 gold electrode on tunneling contact

The invention claimed is:

1. A magnetic revolution counter for the self-detection of error states in the determination of revolution numbers n ascertainable in a predefinable manner by way of the revolution counter, comprising a revolution sensor and a magnetic system configured to generate a rotating magnetic field, the magnetic system comprising an element comprising a pair of magnetic poles mounted to be rotatable about an axis situated between the magnetic poles, or a rotatable magnetic wheel comprising a plurality of magnetic poles situated around an axis of rotation of the magnetic wheel, or a linear scale comprising a plurality of magnetic poles and arranged to be movable in directions of a length of the linear scale, wherein the magnetic system is arranged relative to the revolution sensor whereby the rotating magnetic field moves past the revolution sensor so that the revolution sensor senses the rotation of the rotating magnetic field, and wherein the revolution sensor includes magnetic domain wall conductors composed of open spirals or closed, multiply-wound loops, which are formed by a GMR (giant magnetoresistive) layer stack or a soft magnetic layer comprising locally present TMR (tunnel magnetoresistive) layer stacks and in which magnetic 180° domain walls can be introduced and electrical contacts are provided on the domain wall conductors whereby the domain walls can be located by measuring the electrical resistance of predetermined spiral or loop sections, wherein a predefinable bijective magnetization pattern (MP) of domain walls (DW) and/or domain wall gaps (DWG) is written into the domain wall conductors, the electrical contacts, together with associated domain wall conductor sections captured thereby, are interconnected to form Wheatstone bridges or half bridges that are separate from each other, but can be read out together, wherein the electrical resistance conditions ascertained by the Wheatstone bridges or half bridges are all stored as signal levels in the form of signal level sequences (SLS) in a first memory in tabular form, which for the ascertainment of the present revolution number or displacement number can be continuously compared to sub-tables of target value patterns of signal level sequences stored in a second memory for each permissible revolution i (0≤i≤n), and a third memory is provided, in which sub-tables of error target value patterns for all possible, not intended changes in the written-in magnetization pattern (MP) and signal level sequences (SLS) having deviations, caused thereby, from regular signal level sequences stored in the second memory are stored, which, however, can still be bijectively assigned to a revolution number or a displacement step, and a processing unit is provided by which continuous comparisons can be carried out between the ascertained signal level sequences stored in the first memory and the signal level sequences stored in each of the second and third memories respectively and a result of the comparisons can be output, as a bijective revolution value or displacement value or directly as an incorrected error value, during an entire or a half revolution of the rotatable element, or a displacement increment of the rotatable magnetic wheel or of the linear magnetic scale.

2. The magnetic revolution counter according to claim 1, further comprising an angle sensor or quadrant sensor arranged for detecting the angular positions of the rotating element, or of the magnet wheel, or of linear displacements of the linear scale, a signal of the angle sensor or quadrant sensor specifying which of the sub-tables the second memory assigned to the quadrants, or angle sections, or linear scale sections and sub-tables in the third memory are to be used for the comparison effected by the processing unit.

3. The magnetic revolution counter according to claim 1, wherein the domain wall comprises a multi-turn, substantially rhombus-shaped spiral both ends of which are pointed or each provided with a respective domain wall generator, wherein a defined magnetization pattern (MP) having a predefinable separation between two neighboring domain walls (DW) or domain wall gaps (DWG) is impressed into the substantially rhombus-shaped spiral, and the electrical contacts provided on the domain wall conductors comprise GND (ground) contacts, VCC (higher voltage relative to ground) contacts and additional contacts such that the domain wall conductors, located diagonally opposed, are captured by a respective GND contact and VCC contact collectively, or in VCC contact groups and GND contact groups with a multiplex read-out, and the additional contacts are provided on each individual domain wall conductor section solely on one side and substantially centered between the GND contact and VCC contact, or, with a multiplex read-out, in groups of contacts that contact a plurality of windings as Wheatstone half bridge center contacts.

4. The magnetic revolution counter according to claim 1, wherein the domain wall conductor is a substantially rhombus-shaped closed spiral composed of multiply-wound loops, into which at least two magnetic domain walls are introduced such that the at least two domain walls, by way of means for generating, pinning or deleting domain walls, in a defined manner, are brought into a defined separation by an angle of greater than 360° with respect to one another, based on a change in location thereof from a first to a second position, with a rotation of the outer magnetic field by the angle of greater than 360°, and are thus spaced apart from one another, wherein the electrical contacts provided on the domain wall conductors comprise GND (ground) contacts, VCC (higher voltage relative to ground) contacts and additional contacts such that the domain wall conductors, located diagonally opposed, are captured by a respective GND contact and by a respective VCC contact per winding or, with a multiplex read-out, by a shared GND contact and a VCC contact and the additional contacts are disposed on one side substantially centered between the GND and VCC contacts, on each of the loop sections.

5. The magnetic revolution counter according to claim 1, wherein the domain wall conductors are composed of two juxtaposed multi-turn, substantially rhombus-shaped sub-spirals having the same winding direction, wherein each of the sub-spirals iscaptured by a respective shared GND contact and VCC contact and additional contacts are provided on one side substantially centered between the GND and VCC contacts, and a defined magnetization pattern of domain walls is written into the domain wall conductor, and at least two of the domain walls, by way of means for generating, pinning or deleting domain walls, in a defined manner, are brought into a defined separation by an angle of greater than 360° with respect to one another, based on a change in location thereof from a first to a second position, with a rotation of the outer magnetic field by the angle of greater than 360°, and the domain walls which have been brought into the defined separation are thus spaced apart from one another.

6. The magnetic revolution counter according to claim 1, wherein all the domain wall conductors are configured to extend parallel to one another and to be jointly read out via the electrical contacts and all the domain wall conductors are provided with identical magnetization patterns when initialized.

7. The magnetic revolution counter according to claim 1, wherein the domain wall conductors are composed of a plurality of mutually separated and closed, multiply-wound loops having coprime maximum revolution numbers.

8. The magnetic revolution counter according to claim 3, wherein the domain wall conductors are composed of two juxtaposed multi-turn, substantially rhombus-shaped sub-spirals having the same winding direction, wherein each of the sub-spirals is captured by a respective shared GND contact and VCC contact and additional contacts are provided on one side substantially centered between the GND and VCC contacts, and a defined magnetization pattern of domain walls is written into the domain wall conductor, and at least two of the domain walls, by way of means for generating, pinning or deleting domain walls, in a defined manner, are brought into a defined separation by an angle of greater than 360° with respect to one another, based on a change in location thereof from a first to a second position, with a rotation of the outer magnetic field by the angle of greater than 360°, and the domain walls which have been brought into the defined separation are thus spaced apart from one another.

9. The magnetic revolution counter according to claim 2, wherein all the domain wall conductors are configured to extend parallel to one another and to be jointly read out via the electrical contacts and all the domain wall conductors are provided with identical magnetization patterns when initialized.

10. The magnetic revolution counter according to claim 3, wherein all the domain wall conductors are configured to extend parallel to one another and to be jointly read out via the electrical contacts and all the domain wall conductors are provided with identical magnetization patterns when initialized.

11. The magnetic revolution counter according to claim 4, wherein all the domain wall conductors are configured to extend parallel to one another and to be jointly read out via the electrical contacts and all the domain wall conductors are provided with identical magnetization patterns when initialized.

12. The magnetic revolution counter according to claim 5, wherein all the domain wall conductors are configured to extend parallel to one another and to be jointly read out via the electrical contacts and all the domain wall conductors are provided with identical magnetization patterns when initialized.

13. The magnetic revolution counter according to claim 4, wherein the domain wall conductors are composed of a plurality of mutually separated and closed, multiply-wound loops having coprime maximum revolution numbers.

* * * * *